United States Patent
Goto et al.

(10) Patent No.: US 12,235,483 B2
(45) Date of Patent: Feb. 25, 2025

(54) OPTICALLY ANISOTROPIC FILM, LAMINATE, CIRCULARLY POLARIZING PLATE, AND DISPLAY DEVICE

(71) Applicant: FUJIFILM Corporation, Tokyo (JP)

(72) Inventors: Ryoji Goto, Kanagawa (JP); Yuuta Fujino, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 739 days.

(21) Appl. No.: 17/411,542

(22) Filed: Aug. 25, 2021

(65) Prior Publication Data
US 2022/0113461 A1 Apr. 14, 2022

Related U.S. Application Data

(63) Continuation of application No. PCT/JP2020/007388, filed on Feb. 25, 2020.

(30) Foreign Application Priority Data

Feb. 27, 2019 (JP) .................... 2019-033932

(51) Int. Cl.
*G02B 5/30* (2006.01)
(52) U.S. Cl.
CPC ......... *G02B 5/3083* (2013.01); *G02B 5/3016* (2013.01)
(58) Field of Classification Search
CPC .............................................. G02B 5/30–5/32
See application file for complete search history.

(56) References Cited

U.S. PATENT DOCUMENTS

| 2007/0153178 | A1 | 7/2007 | Rao et al. |
| 2009/0233247 | A1 | 9/2009 | Zengerle et al. |
| 2010/0007828 | A1* | 1/2010 | Nimura ............. G02F 1/133632 156/60 |
| 2010/0045901 | A1 | 2/2010 | Uehira et al. |
| 2012/0236234 | A1* | 9/2012 | Ishiguro ................... G02B 5/22 349/96 |

(Continued)

FOREIGN PATENT DOCUMENTS

| JP | 2001-208913 A | 8/2001 |
| JP | 2008-273925 A | 11/2008 |

(Continued)

OTHER PUBLICATIONS

Office Action, issued by the Japanese Patent Office on Jul. 5, 2022, in connection with Japanese Patent Application No. 2021-502252.

(Continued)

*Primary Examiner* — Christopher Stanford
*Assistant Examiner* — Journey F Sumlar
(74) *Attorney, Agent, or Firm* — Edwards Neils LLC; Jean C. Edwards, Esq.

(57) ABSTRACT

Provided is an optically anisotropic film exhibiting excellent reverse wavelength dispersibility, a laminate, a circularly polarizing plate, and a display device. The optically anisotropic film includes a J-aggregate having an absorption peak of a J-band on a wavelength side longer than a wavelength of 700 nm, in which an absorption at a wavelength of 700 to 900 nm in a fast axis direction of the optically anisotropic film is larger than an absorption at a wavelength of 700 to 900 nm in a slow axis direction of the optically anisotropic film.

18 Claims, 2 Drawing Sheets

(56) References Cited

U.S. PATENT DOCUMENTS

2017/0023717 A1\* 1/2017 Hatanaka ............. G02B 5/3016
2020/0174171 A1 6/2020 Nishkawa et al.

FOREIGN PATENT DOCUMENTS

| | | |
|---|---|---|
| JP | 2009-025671 A | 2/2009 |
| JP | 2009-108267 A | 5/2009 |
| JP | 2009-520239 A | 5/2009 |
| JP | 2009-210929 A | 9/2009 |
| JP | 2009-244493 A | 10/2009 |
| JP | 2015-036732 A | 2/2015 |
| WO | 2019/044859 A1 | 3/2019 |

OTHER PUBLICATIONS

International Search Report issued in PCT/JP2020/007388 on May 12, 2020.
Written Opinion issued in PCT/JP2020/007388 on May 12, 2020.
International Preliminary Report on Patentability completed by WIPO on Apr. 16, 2021 in connection with International Patent Application No. PCT/JP2020/007388.

\* cited by examiner

OPTICALLY ANISOTROPIC FILM, LAMINATE, CIRCULARLY POLARIZING PLATE, AND DISPLAY DEVICE

CROSS-REFERENCE TO RELATED APPLICATIONS

This application is a Continuation of PCT International Application No. PCT/JP2020/007388 filed on Feb. 25, 2020, which was published under PCT Article 21 (2) in Japanese, and which claims priority under 35 U.S.C. § 119 (a) to Japanese Patent Application No. 2019-033932 filed on Feb. 27, 2019. The above applications are hereby expressly incorporated by reference, in their entirety, into the present application.

BACKGROUND OF THE INVENTION

1. Field of the Invention

The present invention relates to an optically anisotropic film, a laminate, a circularly polarizing plate, and a display device.

2. Description of the Related Art

A phase difference film having refractive index anisotropy (optically anisotropic film) has been applied to various uses such as an antireflection film of a display device, and an optical compensation film of a liquid crystal display device.

In recent years, an optically anisotropic film exhibiting reverse wavelength dispersibility has been studied (JP2008-273925A). In addition, the reverse wavelength dispersibility means "negative dispersion" characteristics showing an increase in a birefringence in accordance with an increase in a measurement wavelength in at least a part of a wavelength range in the visible region.

SUMMARY OF THE INVENTION

On the other hand, a reverse wavelength dispersibility exhibited by optically anisotropic films in the related art has not necessarily been sufficient, and accordingly, a further improvement has been required.

More specifically, in a case of taking an example in which a λ/4 plate (¼ wavelength plate) is used as an optically anisotropic film, it is ideal that a phase difference in the visible region is a ¼ wavelength of a measurement wavelength. However, in optically anisotropic films in the related art, there is a tendency that a deviation from an ideal curve appears on a long wavelength side in the visible region. Furthermore, in the present specification, the optical characteristics which are closer to the ideal curve indicate that the reverse wavelength dispersibility is excellent.

Taking the circumstances into consideration, the present invention has an object to provide an optically anisotropic film exhibiting excellent reverse wavelength dispersibility.

In addition, the present invention has another object to provide a laminate, a circularly polarizing plate, and a display device.

The present inventors have conducted intensive studies on problems in the related art, and as a result, they have found that the objects can be accomplished by the following configurations.

(1) An optically anisotropic film comprising a J-aggregate having an absorption peak of a J-band on a wavelength side longer than a wavelength of 700 nm,
in which an absorption at a wavelength of 700 to 900 nm in a fast axis direction of the optically anisotropic film is larger than an absorption at a wavelength of 700 to 900 nm in a slow axis direction of the optically anisotropic film.

(2) The optically anisotropic film as described in (1),
in which the absorption peak is positioned in a wavelength range of 700 to 900 nm.

(3) The optically anisotropic film as described in (1) or (2),
in which the optically anisotropic film satisfies relationships of Formula (A) which will be described later and Formula (B) which will be described later.

(4) The optically anisotropic film as described in any one of (1) to (3),
in which the optically anisotropic film is formed of a composition including a liquid crystal compound or a polymer, and a coloring agent, and the J-aggregate includes the coloring agent.

(5) The optically anisotropic film as described in (4),
in which the coloring agent is a near-infrared absorbing coloring agent.

(6) The optically anisotropic film as described in any one of (1) to (5),
in which in a case where a wavelength exhibiting a maximum absorbance at a wavelength of 700 to 900 nm in the fast axis direction of the optically anisotropic film is defined as a wavelength of X, a ratio D of an absorbance at the wavelength of X in the slow axis direction of the optically anisotropic film to an absorbance at the wavelength of X in the fast axis direction of the optically anisotropic film satisfies a relationship of Formula (C) which will be described later.

(7) The optically anisotropic film as described in any one of (1) to (6),
in which an in-plane retardation at a wavelength of 550 nm is 110 to 160 nm.

(8) A laminate comprising:
the optically anisotropic film as described in any one of (1) to (7); and
a gas barrier layer arranged on the optically anisotropic film.

(9) A circularly polarizing plate comprising:
the optically anisotropic film as described in any one of (1) to (7) or the laminate as described in (8); and
a polarizer.

(10) A display device comprising:
a display element; and
the circularly polarizing plate as described in (9), arranged on the display element.

According to the present invention, it is possible to provide an optically anisotropic film exhibiting excellent reverse wavelength dispersibility.

In addition, according to the present invention, it is also possible to provide a laminate, a circularly polarizing plate, and a display device.

DESCRIPTION OF THE PREFERRED EMBODIMENTS

Figure 1:
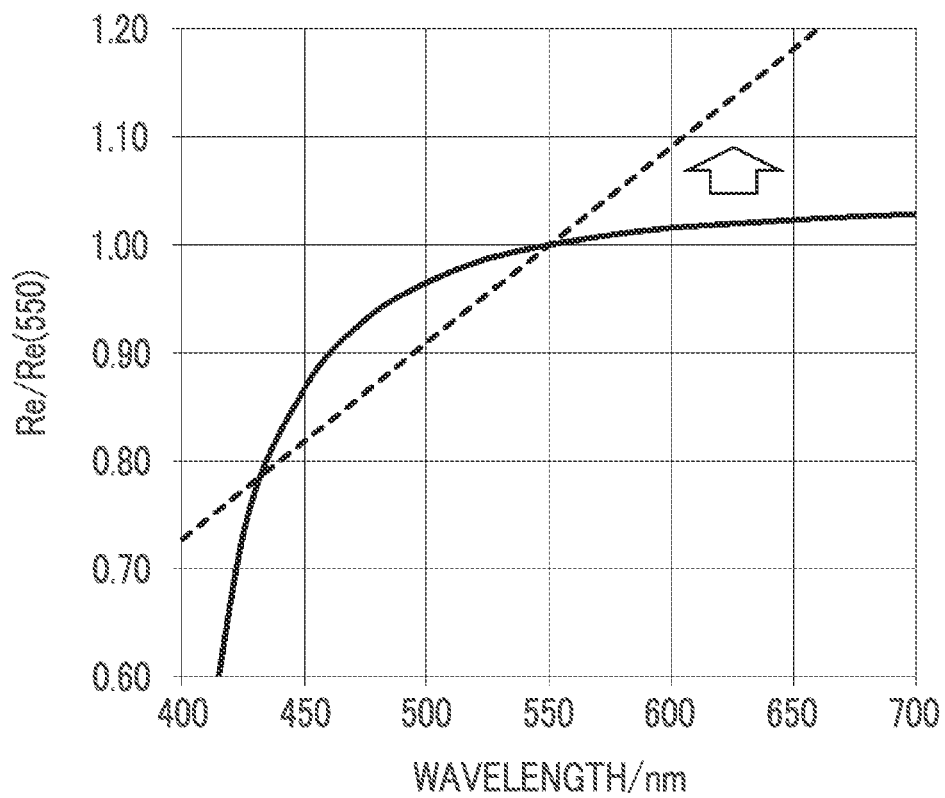
FIG. 1 is a view showing a comparison between the wavelength dispersion of an optically anisotropic film exhibiting reverse wavelength dispersibility in the related art and the wavelength dispersion of an ideal phase difference.

Hereinafter, the present invention will be described in detail. Furthermore, in the present specification, a numerical range expressed using "to" means a range that includes the preceding and succeeding numerical values of "to" as the lower limit value and the upper limit value, respectively. First, terms used in the present specification will be described. In addition, a fast axis and a slow axis are each defined at 550 nm unless otherwise specified.

In the present invention, $Re(\lambda)$ and $Rth(\lambda)$ represent an in-plane retardation and a thickness-direction retardation at a wavelength of $\lambda$, respectively. The wavelength of $\lambda$ refers to 550 nm unless otherwise specified.

In the present invention, $Re(\lambda)$ and $Rth(\lambda)$ are values measured at a wavelength of $\lambda$ in AxoScan OPMF-1 (manufactured by Opto Science, Inc.). By inputting an average refractive index $((nx+ny+nz)/3)$ and a film thickness (d (μm)) to AxoScan, the values can be calculated:

Slow axis direction (°)

$Re(\lambda)=R0(\lambda)$ $Rth(\lambda)=((nx+ny)/2-nz)\times d$.

Furthermore, $R0(\lambda)$ is expressed in a numerical value calculated with AxoScan OPMF-1, but means $Re(\lambda)$.

In the present specification, the refractive indices, nx, ny, and nz are measured with an Abbe refractometer (NAR-4T, manufactured by Atago Co., Ltd.), using a sodium lamp ($\lambda$=589 nm) as a light source. In addition, in a case where a wavelength dependency is measured, the wavelength dependency can be measured with a multi-wavelength Abbe refractometer DR-M2 (manufactured by Atago Co., Ltd.) in combination with an interference filter.

Moreover, the values mentioned in Polymer Handbook (JOHN WILEY & SONS, INC.) and the catalogues of various optical films can be used. The values of the average refractive indices of major optical films are exemplified below: cellulose acylate (1.48), cycloolefin polymer (1.52), polycarbonate (1.59), polymethyl methacrylate (1.49), and polystyrene (1.59).

Moreover, in the present specification, "visible rays" are intended to mean a light at a wavelength of 400 nm or more and less than 700 nm. Further, "near-infrared rays" are intended to mean a light at a wavelength from 700 nm to 2,000 nm. In addition, "ultraviolet rays" are intended to mean a light at a wavelength of 10 nm or more and less than 400 nm.

In addition, in the present specification, angles (for example, an angle of "90°") and a relationship thereof (for example, "perpendicular" and "parallel") include a range of errors tolerable in the technical field to which the present invention belongs. For example, the angle means an angle in a range of less than ±10° of a rigorous angle, and the error from the rigorous angle is preferably 5° or less, and more preferably 3° or less.

The bonding direction of a divalent group (for example, —O—CO—) as noted in the present specification is not particularly limited, and for example, in a case where $D^1$ in Formula (I) which will be described later is —O—CO—, and *1 and *2 represent a bonding position to the Ar side and a bonding position to the $G^1$ side, respectively, $D^1$ may be either *1-O—CO-*2 or *1-CO—O-*2.

One of feature points of the optically anisotropic film of an embodiment of the present invention may be that a J-aggregate is used and the absorption characteristics of the optically anisotropic film at a wavelength of 700 to 900 nm are controlled.

Hereinafter, features of the present invention will be described in detail.

First, FIG. 1 shows the wavelength dispersion characteristics of a phase difference ($Re(\lambda)$) at each wavelength in the visible region with a phase difference ($Re(550 \text{ nm})$) at a measurement wavelength of 550 nm being normalized as 1. For example, the above-mentioned ideal $\lambda/4$ plate has "negative dispersion" characteristics in that a phase difference increases as a measurement wavelength increases since the phase difference is in a relationship in proportional with the measurement wavelength, as indicated by a dotted line in FIG. 1. In contrast, with regard to an optically anisotropic film exhibiting reverse wavelength dispersibility in the related art, the wavelength dispersion characteristics are at positions overlapping an ideal curve indicated by a dotted line in the short wavelength range but show a tendency to deviate from the ideal curve in the long wavelength range, as indicated by a solid line in FIG. 1.

In the optically anisotropic film of the embodiment of the present invention, it is possible to approximate the optical characteristics in the long wavelength range to the ideal curve as indicated by an outlined arrow by using a J-aggregate and controlling the absorption characteristics at a wavelength of 700 to 900 nm of the optically anisotropic film.

Figure 2:
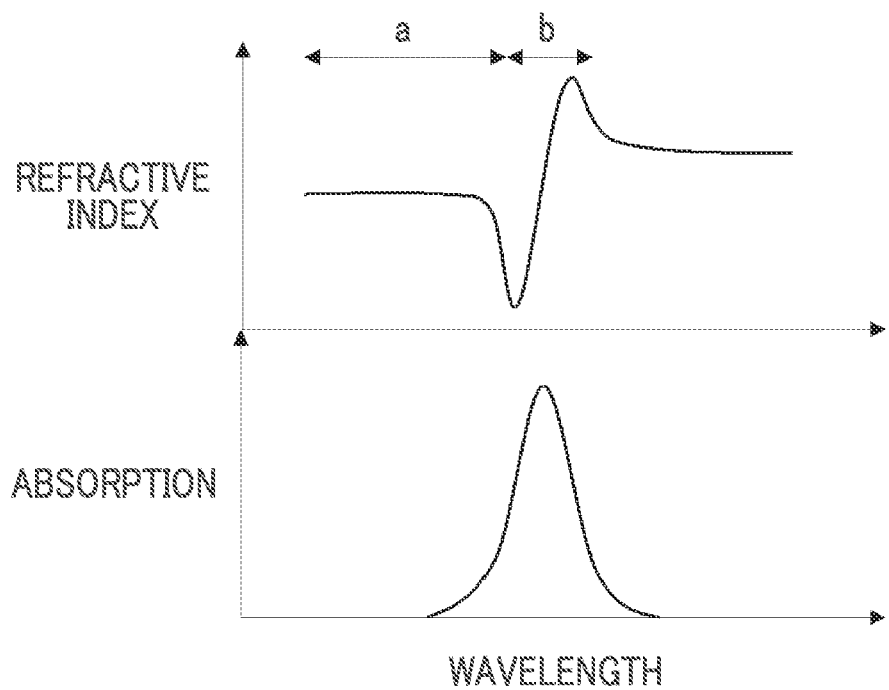
FIG. 2 is a view showing the wavelength dispersion characteristics with respect to a refractive index and an absorption coefficient of an organic molecule.

As a reason why the characteristics are obtained, the refractive index wavelength dispersion characteristics of general organic molecules will firstly be described with reference to FIG. 2. In FIG. 2, the upper side shows the behavior of a refractive index with respect to a wavelength, and the lower side shows the behavior (absorption spectrum) of absorption characteristics with respect to the wavelength.

For the organic molecule, a refractive index n in a region (a region a in FIG. 2) away from the intrinsic absorption wavelength decreases monotonically as the wavelength increases. Such the dispersion is referred to as "normal dispersion". In contrast, a refractive index n in a wavelength band including an intrinsic absorption (a region b in FIG. 2) rapidly increases as the wavelength increases. Such the dispersion is referred to as "anomalous dispersion". That is, as shown in FIG. 2, an increase or a decrease in the refractive index is observed immediately before the wavelength range with the absorption.

In the optically anisotropic film of the embodiment of the present invention, the absorption at a wavelength of 700 to 900 nm in the fast axis direction is larger than the absorption at a wavelength of 700 to 900 nm in the slow axis direction under the influence of the J-aggregate. Hereinafter, such absorption characteristics are also referred to as absorption characteristics X. As described in detail later, the absorption characteristics X are accomplished by arranging the axial direction having a high absorbance of the J-aggregate in the optically anisotropic film to be in parallel with the fast axis direction.

In the optically anisotropic film exhibiting the absorption characteristics X, the ordinary ray refractive index is further reduced, as compared with the optically anisotropic film not having absorption characteristics X.

Figure 3:
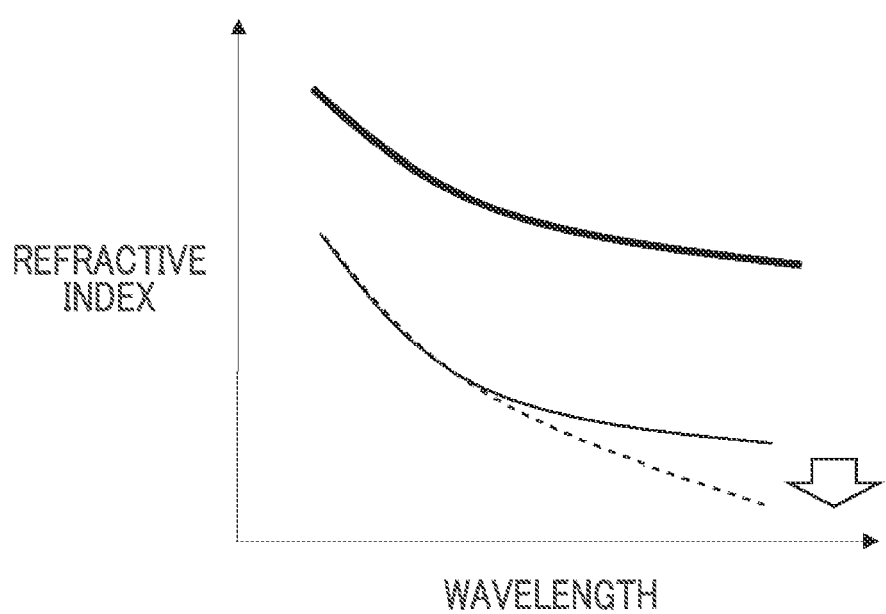
FIG. 3 is a view showing a comparison of the wavelength dispersion between an extraordinary ray refractive index ne and an ordinary ray refractive index no depending on the presence or absence of predetermined absorption characteristics.

Specifically, FIG. 3 is a view showing a comparison of the wavelength dispersion between an extraordinary ray refractive index ne and an ordinary ray refractive index no depending on the presence or absence of the absorption characteristics X. In FIG. 3, the thick line indicates a curve of the extraordinary ray refractive index ne in the absence of the absorption characteristics X, and the solid line indicates a curve of the ordinary ray refractive index no in the absence of the absorption characteristics X. In contrast, in the optically anisotropic film of the embodiment of the present invention, having the absorption characteristics X, a value of the ordinary ray refractive index no in the long wavelength range in the visible region is further reduced as indicated by a broken line under the influence derived from an absorption at a wavelength of 700 to 900 nm as shown in FIG. 2. As a result, a birefringence Δn which is a difference between the extraordinary ray refractive index ne and the ordinary ray refractive index no is larger in the long wavelength range in the visible region, and thus, the behavior indicated by an arrow shown in FIG. 1 is accomplished.

Hereinafter, the configuration of the optically anisotropic film will be described in detail.

<J-Aggregate>

The optically anisotropic film includes a J-aggregate having an absorption peak of a J-band on a wavelength side longer than a wavelength of 700 nm.

The J-aggregate is an assembly of coloring agents. More specifically, the J-aggregate refers to a state in which coloring agent molecules are associated with each other with a constant deviation angle (slip angle). The J-aggregate has an absorption band with a narrow half-width and a high absorption light absorption coefficient on a long wavelength side as compared with a case of a single coloring agent molecule in a solution state. This sharpened absorption band is referred to as a J-band. The J-band is described in detail in literature (for example, Photographic Science and Engineering Vol 18, No 323-335 (1974)). Whether or not it is a J-aggregate can be easily determined by measuring its absorption maximum wavelength.

The absorption peak of the J-band is shifted to a long wavelength side with respect to the absorption peak of a single coloring agent molecule, and a difference between the wavelength of an absorption peak of the J-band and the wavelength of an absorption peak of the single coloring agent molecule is preferably 10 to 200 nm, more preferably 30 to 150 nm, and still more preferably 50 to 100 nm.

A J-compound in the optically anisotropic film has an absorption peak of a J-band on a wavelength side longer than a wavelength of 700 nm. Above all, it is preferable to have an absorption peak in the near-infrared region.

From the viewpoint that the wavelength dispersibility on a long wavelength side of the optically anisotropic film can be adjusted and an optically anisotropic film without coloration can be manufactured, a peak wavelength (maximum absorption wavelength) of the J-band of the J-aggregate is preferably positioned in a range of 700 to 1,300 nm, more preferably positioned in a range of 750 to 1,200 nm, and still more preferably positioned in a range of 800 to 1,000 nm.

The coloring agent which can be included in the J-aggregate will be described in detail later.

In the optically anisotropic film, the absorption at a wavelength of 700 to 900 nm in the fast axis direction of the optically anisotropic film (hereinafter also referred to as an "absorption F") is larger than the absorption at a wavelength of 700 to 900 nm in the slow axis direction of the optically anisotropic film (hereinafter also referred to as an "absorption S").

An expression, "the absorption F is larger than the absorption S", is intended to mean that a maximum absorbance in a wavelength range of 700 to 900 nm of an absorption spectrum obtained upon irradiation of the optically anisotropic film with polarized light in parallel with the fast axis of the optically anisotropic film is larger than a maximum absorbance in a wavelength range of 700 to 900 nm of an absorption spectrum obtained upon irradiation of the optically anisotropic film with polarized light in parallel with the slow axis of the optically anisotropic film.

In addition, the measurement can be carried out using a spectrophotometer (MPC-3100 manufactured by SHIMADZU Corporation) equipped with a polarizer for infrared rays.

In addition, the anisotropy of the absorption as described above can be realized by using the above-mentioned J-aggregate. In particular, it is possible to make the absorption F larger than the absorption S by using a dichroic J-aggregate to set the axial direction having a higher absorbance of the J-aggregate to be in parallel with the fast axis direction of the optically anisotropic film.

In a case where the wavelength exhibiting a maximum absorbance at a wavelength of 700 to 900 nm in the fast axis direction of the optically anisotropic film is defined as a wavelength of λ, a ratio D of an absorbance at the wavelength of X in the slow axis direction of the optically anisotropic film to an absorbance at the wavelength of X in the fast axis direction of the optically anisotropic film is not particularly limited, and is often more than 0.01 and 0.80 or less. In a case where the ratio D is large, it is possible to improve the reverse wavelength dispersibility of the optically anisotropic film even with a reduction in the amount of the near-infrared absorbing coloring agent to be used. As a result, from the viewpoint that the brightness of an organic electroluminescence (EL) display device is more excellent in a case the optically anisotropic film is applied as an antireflection film of the organic EL display device, it is preferable to satisfy a relationship of Formula (C).

$$0.01 < D < 0.61 \quad \text{Formula (C)}$$

Among them, the ratio D is more preferably 0.03 to 0.50, and still more preferably 0.05 to 0.30.

In calculation of the ratio D, first, a wavelength of X (nm) that indicates a maximum absorbance of the absorption spectrum obtained upon irradiation of the optically anisotropic film with polarized light parallel to the fast axis of the optically anisotropic film at a wavelength of 700 to 900 nm is determined. Next, a ratio (absorbance B/absorbance A) of the absorbance A at the wavelength of X nm of an absorption spectrum obtained upon irradiation of the optically anisotropic film with polarized light in parallel with the fast axis of the optically anisotropic film to the absorbance B at the wavelength of X of an absorption spectrum obtained upon irradiation of the optically anisotropic film with polarized light in parallel with the slow axis of the optically anisotropic film is calculated.

In addition, the measurement can be carried out using a spectrophotometer (MPC-3100 manufactured by SHIMADZU Corporation) equipped with a polarizer for infrared rays.

The optically anisotropic film preferably satisfies a relationship of Formula (A).

$$Re(450)/Re(550) < 1.00 \quad \text{Formula (A)}$$

Re(450) represents an in-plane retardation of the optically anisotropic film at a wavelength of 450 nm and Re(550) represents an in-plane retardation of the optically anisotropic film at a wavelength of 550 nm.

Among those, Re(450)/Re(550) is preferably 0.97 or less, more preferably 0.92 or less, and still more preferably 0.87 or less. A lower limit thereof is not particularly limited, but is often 0.75 or more.

The optically anisotropic film preferably satisfies a relationship of Formula (B).

$$Re(650)/Re(550) > 1.00 \qquad \text{Formula (B)}$$

Re(650) represents an in-plane retardation of the optically anisotropic film at a wavelength of 650 nm.

Among those, Re(650)/Re(550) is preferably 1.05 or more, more preferably 1.08 or more, and still more preferably 1.10 or more. An upper limit thereof is not particularly limited, but is preferably 1.25 or less, and more preferably 1.20 or less.

Re(550) of the optically anisotropic film is not particularly limited, but from the viewpoint that the optically anisotropic film is useful as a λ/4 plate, Re(550) is preferably 110 to 160 nm, and more preferably 120 to 150 un.

The thickness of the optically anisotropic film is not particularly limited, but is preferably 10 µm or less, more preferably 0.5 to 8.0 µm, and still more preferably 0.5 to 6.0 µm from the viewpoint of reducing the thickness.

In addition, in the present specification, the thickness of the optically anisotropic film is intended to mean an average thickness of the optically anisotropic film. The average thickness is determined by measuring the thickness at any five or more points of the optically anisotropic film and obtaining an arithmetic mean of the values.

The J-aggregate in the optically anisotropic film is not particularly limited in terms of a type thereof as long as it is a J-aggregate satisfying the above-mentioned characteristics. The type of a coloring agent capable of forming a J-aggregate is not particularly limited and may be a visible absorbing coloring agent or a near-infrared absorbing coloring agent, and the near-infrared absorbing coloring agent is preferable.

Examples of the visible absorbing coloring agent include methine-based coloring agents (for example, cyanine-based coloring agents, merocyanine-based coloring agents, arylidene-based coloring agents, oxonol-based coloring agents, and styryl-based coloring agents).

Examples of the near-infrared absorbing coloring agent include diketopyrrolopyrole-based coloring agents, diimmonium-based coloring agents, phthalocyanine-based coloring agents, naphthalocyanine-based coloring agents, azo-based coloring agents, polymethine-based coloring agents, anthraquinone-based coloring agents, pyrylium-based coloring agents, squarylium-based coloring agents, triphenylmethane-based coloring agents, cyanine-based coloring agents, and aminium-based coloring agents.

The visible absorbing coloring agent is a coloring agent which has a maximum absorption wavelength in the visible region. The near-infrared absorbing coloring agent is a coloring agent which has a maximum absorption wavelength in the near-infrared region.

The coloring agents may be used alone or in combination of two or more kinds thereof.

From the viewpoint that the effect of the present invention is more excellent, the maximum absorption wavelength of the near-infrared absorbing coloring agent is preferably positioned in a wavelength range of 700 to 1,200 nm, and more preferably positioned in a wavelength range of 700 to 900 nm.

From the viewpoint that the effect of the present invention is more excellent, an integrated value of the absorbances in a wavelength range of 700 to 900 nm of the near-infrared absorbing coloring agent is preferably larger than an integrated value of the absorbances in a wavelength range of 400 to 700 nm of the near-infrared absorbing coloring agent.

The integrated value of the absorbances is a value obtained by summing the absorbances at the respective wavelengths ranging from X to Y run.

The measurement can be carried out using a spectrophotometer (MPC-3100 manufactured by SHIMADZU Corporation).

Moreover, the coloring agent (the visible absorbing coloring agent and the near-infrared absorbing coloring agent) is preferably a dichroic coloring agent. Further, the dichroic coloring agent refers to a coloring agent having a property that an absorbance in the long axis direction and an absorbance in the short axis direction in the molecule are different from each other.

From the viewpoint that the effect of the present invention is more excellent, it is preferable that the coloring agent has a mesogenic group. By incorporating the mesogenic group into the coloring agent, the coloring agent can be easily aligned with a liquid crystal compound which will be described later and predetermined absorption characteristics can be easily controlled.

The mesogenic group is a functional group which is rigid and has alignment. Examples of the structure of the mesogenic group include a structure in which a plurality of groups selected from the group consisting of an aromatic ring group (an aromatic hydrocarbon ring group and an aromatic heterocyclic group) and an alicyclic group are linked directly or via a linking group (which represents, for example, —O—, —CO—, —C(R$^O$)$_2$—, —CH=CH—, —CH=N—, —N=N—, —C≡C—, —NR$^O$—, or a combination thereof (for example, —COO—, —CONR$^O$—, —COOCH$_2$CH$_2$—, —CONRCH$_2$CH$_2$—, —OCOCH=CH—, and —C≡C—C≡C—), in which R$^O$ represents a hydrogen atom or an alkyl group having 1 to 6 carbon atoms).

The optically anisotropic film may include a component other than the J-aggregate, and examples of the component include a liquid crystal compound and a polymer which will be described later.

Furthermore, in a case where an optically anisotropic film is formed using a composition including a polymerizable liquid crystal compound as described later, the optically anisotropic film includes a polymer of the polymerizable liquid crystal compound.

As one of suitable aspects of the optically anisotropic film, an optically anisotropic film formed using a composition including a liquid crystal compound or a polymer, and a coloring agent is preferable. In this case, the J-aggregate includes the coloring agents included in the composition. That is, the coloring agents included in the composition are associated to form a J-aggregate.

Examples of the coloring agent include a visible absorbing coloring agent and a near-infrared absorbing coloring agent, as mentioned above, and the near-infrared absorbing coloring agent is preferable.

Suitable aspects of the near-infrared absorbing coloring agent include a compound represented by Formula (1).

The compound represented by Formula (1) has a less absorption in the visible region, and an optically anisotropic film thus obtained is further suppressed from being colored. In addition, since the compound includes a group having a mesogenic group, it is easily aligned together with the liquid crystal compound. At this time, the group having a mesogenic group is arranged such that it extends horizontally from a fused ring moiety including a nitrogen atom at the center of the compound, and therefore, the fused ring moiety is easily aligned in the direction perpendicular to the slow axis of an optically anisotropic film thus formed. That is, an absorption in the near-infrared region (in particular, at a wavelength of 700 to 900 nm) derived from the fused ring moiety is easily obtained in the direction perpendicular to the slow axis of the optically anisotropic film, and an optically anisotropic film exhibiting desired characteristics is easily obtained.

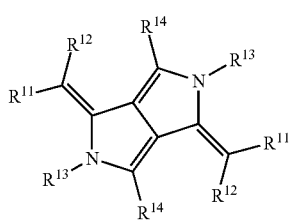

Formula (1)

$R^{11}$ and $R^{12}$ each independently represent a hydrogen atom or a substituent, at least one of $R^{11}$ or $R^{12}$ is an electron-withdrawing group, and $R^{11}$ and $R^{12}$ may be bonded to each other to form a ring.

Examples of the substituent include an alkyl group, an alkenyl group, an alkynyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, an aromatic heterocyclic thio group, a sulfonyl group, a sulfinyl group, a ureide group, a phosphoric acid amide group, a hydroxy group, a mercapto group, a halogen atom, a cyano group, a sulfo group, a carboxyl group, a nitro group, a hydroxamic acid group, a sulfino group, a hydrazino group, an imino group, a heterocyclic group (for example, a heteroaryl group), a silyl group, and a group formed by combination of these groups. Further, the substituent may further be substituted with a substituent.

The electron-withdrawing group represents a substituent whose a Hammett's sigma para value (σp value) is positive, and examples thereof include a cyano group, an acyl group, an alkyloxycarbonyl group, an aryloxycarbonyl group, a sulfamoyl group, a sulfinyl group, and a heterocyclic group.

These electron-withdrawing groups may further be substituted.

The Hammett's substituent constant σ value will be described. The Hammett rule is an empirical rule proposed by L. P. Hammett in 1935 in order to quantitatively discuss an influence of a substituent exerted on a reaction or equilibrium of a benzene derivative, and nowadays, its validity has been widely recognized. The substituent constants required for the Hammett rule include a σp value and a σm value, and these values are described in many general scientific articles. These are specifically described in, for example, "Lange's Handbook of Chemistry" edited by I. A. Dean, 12$^{th}$ edition, 1979 (McGraw-Hill), "Region of Chemistry", extra edition, No. 122, pp. 96 to 103, 1979 (Nankodo Co., Ltd.), Chem. Rev., 1991, Vol. 91, pp. 165 to 195, and the like. As the electron-withdrawing group in the embodiment of the present invention, a substituent having a Hammett's substituent constant σp value of 0.20 or more is preferable. The σp value is preferably 0.25 or more, more preferably 0.30 or more, and still more preferably 0.35 or more. An upper limit thereof is not particularly limited, but is preferably 0.80 or less.

Specific examples thereof include a cyano group (0.66), a carboxyl group (—COOH: 0.45), an alkoxycarbonyl group (—COOMe: 0.45), an aryloxycarbonyl group (—COOPh: 0.44), a carbamoyl group (—CONH$_2$: 0.36), an alkylcarbonyl group (—COMe: 0.50), an arylcarbonyl group (—COPh: 0.43), an alkylsulfonyl group (—SO$_2$Me: 0.72), and an arylsulfonyl group (—SO$_2$Ph: 0.68).

In the present specification, Me represents a methyl group and Ph represents a phenyl group. Further, the values in parentheses are σp values of the representative substituents as extracted from Chem. Rev., 1991, Vol. 91, pp. 165 to 195.

In a case where $R^{11}$ and $R^{12}$ are bonded to form a ring, $R^{11}$ and $R^{12}$ form a 5- to 7-membered ring (preferably a 5- or 6-membered ring), and it is typically preferable to use a ring thus formed as an acidic nucleus in a merocyanine coloring agent.

As the ring formed by the bonding of $R^{11}$ and $R^{12}$, a 1,3-dicarbonyl nucleus, a pyrazolinone nucleus, a 2,4,6-triketohexahydropyrimidine nucleus (including a thioketone form), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus, or an indanone nucleus is preferable.

$R^{11}$ is preferably a heterocyclic group, and more preferably an aromatic heterocyclic group. The heterocyclic group may be either a monocycle or a polycycle. As the heterocyclic group, a pyrazole ring group, a thiazole ring group, an oxazole ring group, an imidazole ring group, an oxadiazole ring group, a thiadiazole ring group, a triazole ring group, a pyridine ring group, a pyridazine ring group, a pyrimidine ring group, a pyrazine ring group, such the benzo-fused ring group (for example, a benzothiazole ring group and a benzopyrazine ring group) or a naphtho-fused ring group, or a composite of these fused rings is preferable.

The heterocyclic group may be substituted with a substituent. Examples of the substituent include the groups exemplified as the substituent represented by each of Ru and $R^{12}$.

$R^{13}$'s each independently represent a hydrogen atom, an alkyl group, an aryl group, a heteroaryl group, a substituted boron (—B(Ra)$_2$, Ra represents a substituent), or a metal atom, or may be covalently bonded or coordinately bonded with $R^{11}$.

The substituent of the substituted boron represented by $R^{13}$ has the same definition as the above-mentioned substituent for each of $R^{11}$ and $R^{12}$, and is preferably an alkyl group, an aryl group, or a heteroaryl group. The substituent of the substituted boron (for example, the above-mentioned alkyl group, aryl group, or heteroaryl group) may further be substituted with a substituent. Examples of the substituent include the groups exemplified as the substituent represented by each of $R^{11}$ and $R^{12}$.

In addition, the metal atom represented by $R^{13}$ is preferably a transition metal atom, a magnesium atom, an aluminum atom, a calcium atom, a barium atom, a zinc atom, or a tin atom, and more preferably the aluminum atom, the zinc atom, the tin atom, the vanadium atom, the iron atom, the cobalt atom, the nickel atom, the copper atom, the palladium atom, the iridium atom, or the platinum atom.

$R^{14}$'s each independently represent a group having a mesogenic group. The definition of the mesogenic group is the same as mentioned above.

$R^{14}$ is preferably a group represented by Formula (2). * represents a bonding position.

$$*-M^1-(X^1-M^2)_n-X^2-P \qquad \text{Formula (2)}$$

$M^1$ represents a substituted or unsubstituted arylene group, or a substituted or unsubstituted heteroarylene group. Examples of the arylene group include a phenylene group. Examples of the heteroarylene group include a divalent group obtained by removing any two hydrogen atoms from a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, such the benzo-fused ring (for example, a benzothiazole ring and a benzopyrazine ring) or a naphtho-fused ring, or a composite of these fused rings. In a case where the arylene group and the heteroarylene group have a substituent, examples of the substituent include the groups exemplified as the substituent represented by each of $R^{11}$ and $R^{12}$.

$X^1$ represents a single bond, —O—, —CO—, —C($R^0$)$_2$—, —CH=CH—, —CH=N—, —N=N—, —C≡C—, —NR$^0$—, or a combination thereof (for example, —COO—, —CONR*—, —COOCH$_2$CH$_2$—, —CONRCH$_2$CH$_2$—, —OCOCH=CH—, and —C≡C—C≡C—). $R^0$ represents a hydrogen atom or an alkyl group having 1 to 5 carbon atoms.

$M^2$ represents a substituted or unsubstituted arylene group, a substituted or unsubstituted heteroarylene group, or a substituted or unsubstituted cycloalkylene group. Examples of the arylene group include a phenylene group. Examples of the heteroarylene group include a divalent group obtained by removing any two hydrogen atoms from a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, such the benzo-fused ring (for example, a benzothiazole ring and a benzopyrazine ring) or a naphtho-fused ring, or a composite of these fused rings. The number of carbon atoms included in the cycloalkylene group is preferably 5 to 7. In a case where the arylene group, the heteroarylene group, and the cycloalkylene group have a substituent, examples of the substituent include the groups exemplified as the substituent represented by each of $R^{11}$ and $R^{12}$.

$X^2$ represents a single bond or a divalent linking group. Examples of the divalent linking group include a divalent hydrocarbon group (for example, a divalent aliphatic hydrocarbon group such as an alkylene group having 1 to 10 carbon atoms, an alkenylene group having 1 to 10 carbon atoms, and an alkynylene group having 1 to 10 carbon atoms, and a divalent aromatic hydrocarbon group such as an arylene group), a divalent heterocyclic group, —O—, —S—, —NH—, —N(Q)-, —CO—, or a group formed by combination of these groups (for example, —O-divalent hydrocarbon group-, —(O-divalent hydrocarbon group)$_m$-O— (m represents an integer of 1 or more), and -divalent hydrocarbon group-O—CO—). Q represents a hydrogen atom or an alkyl group.

n represents 1 to 10. Among these, n is preferably 1 to 5, and more preferably 2 to 4.

P represents a hydrogen atom or a polymerizable group. The definition of the polymerizable group is the same as that of the polymerizable group which may be contained in the above-mentioned liquid crystal compound.

The near-infrared absorbing coloring agent is more preferably a compound represented by Formula (3).

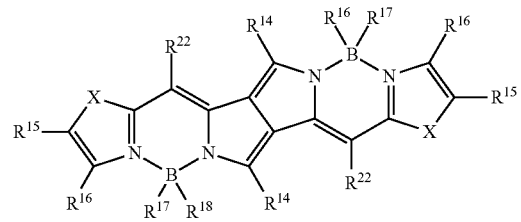

Formula (3)

The definition of $R^{11}$ is the same as mentioned above.

$R^{22}$'s each independently represent a cyano group, an acyl group, an alkoxycarbonyl group, an alkylsulfinyl group, an arylsulfinyl group, or a nitrogen-containing heteroaryl group.

$R^{15}$ and $R^{16}$ each independently represent a hydrogen atom, an alkyl group, an alkoxy group, an aryl group, or a heteroaryl group, and $R^{15}$ and $R^{16}$ may be bonded to each other to form a ring. Examples of the ring thus formed include an alicycle having 5 to 10 carbon atoms, an aromatic hydrocarbon ring having 6 to 10 carbon atoms, and an aromatic heterocyclic ring having 3 to 10 carbon atoms. The ring formed by the bonding of $R^{11}$ and $R^{16}$ may further be substituted with a substituent. Examples of the substituent include the groups exemplified in the description of the substituent represented by each of $R^{11}$ and $R^{12}$.

$R^{17}$ and $R^{18}$ each independently represent an alkyl group, an alkoxy group, an aryl group, or a heteroaryl group. The group represented by each of $R^{17}$ and $R^{18}$ may further be substituted with a substituent. Examples of the substituent include the groups exemplified in the description of the substituent represented by each of $R^{11}$ and $R^{12}$.

X's each independently represent an oxygen atom, a sulfur atom, —NR—, —CRR'—, —CH=CH—, or —N=CH—, and R and R' each independently represent a hydrogen atom, an alkyl group, or an aryl group.

The content of the coloring agent in the composition is not particularly limited, but from the viewpoint that the effect of the present invention is more excellent, the content is preferably 5% to 70% by mass, and more preferably 10% to 50% by mass with respect to the total mass of the liquid crystal compound.

<Liquid Crystal Compound>

The type of the liquid crystal compound is not particularly limited, but the liquid crystal compounds can be classified into a rod-shaped type (rod-shaped liquid crystal compound) and a disk-shaped type (disk-shaped liquid crystal compound, a discotic liquid crystal compound) based on the shape. Each of the types can further be classified into a low-molecular type and a high-molecular type. The expression, being high-molecular, generally refers to having a degree of polymerization of 100 or more (Polymer Physics-Phase Transition Dynamics, by Masao Doi, page 2, published by Iwanami Shoten, Publishers, 1992). In addition, two or more kinds of the rod-shaped liquid crystal compounds, two or more kinds of the disk-shaped liquid crystal compounds, or a mixture of the rod-shaped liquid crystal compound and the disk-shaped liquid crystal compound may be used.

The position of the maximum absorption wavelength of the liquid crystal compound is not particularly limited, but from the viewpoint that the effect of the present invention is more excellent, it is preferable that the maximum absorption wavelength is positioned in the ultraviolet region.

The liquid crystal compound is preferably a reverse wavelength dispersible liquid crystal compound. The reverse wavelength dispersible liquid crystal compound means a compound in which an optically anisotropic film formed using the compound exhibits reverse wavelength dispersibility. That is, the reverse wavelength dispersible liquid crystal compound means a compound in which the in-plane retardation of an optically anisotropic film formed using the compound increases as the measurement wavelength increases and approaches an ideal curve.

From the viewpoint that changes in the temperature and the humidity of the optical characteristics can be suppressed, a liquid crystal compound (hereinafter also referred to as a "polymerizable liquid crystal compound") having a polymerizable group is preferable as the liquid crystal compound. The liquid crystal compounds may be a mixture of two or more kinds thereof, and in this case, it is preferable that at least one has two or more polymerizable groups.

That is, it is preferable that the optically anisotropic film is a layer formed by the fixation of a composition including a polymerizable liquid crystal compound by polymerization or the like, and in this case, it is not necessary to exhibit the liquid crystallinity any longer after forming the layer.

The type of the polymerizable group is not particularly limited, and a polymerizable group which is radically polymerizable or cationically polymerizable is preferable.

A known radically polymerizable group can be used as the radically polymerizable group, and an acryloyl group or a methacryloyl group is preferable.

A known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is preferable, and the epoxy group, the oxetanyl group, or the vinyloxy group is more preferable.

In particular, preferred examples of the polymerizable group include the following groups.

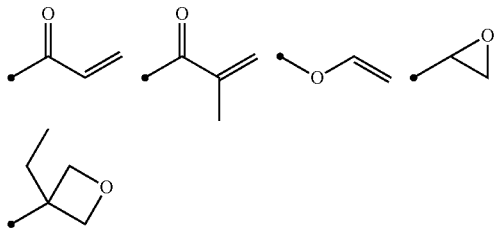

Among those, a compound represented by Formula (I) is preferable as the liquid crystal compound.

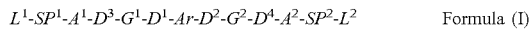

$L^1$-$SP^1$-$A^1$-$D^3$-$G^1$-$D^1$-Ar-$D^2$-$G^2$-$D^4$-$A^2$-$SP^2$-$L^2$    Formula (I)

In Formula (I), $D^1$, $D^2$, $D^3$, and $D^4$ each independently represent a single bond, —O—CO—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—.

$R^1$, $R^2$, $R^3$, and $R^4$ each independently represent a hydrogen atom, a fluorine atom, or an alkyl group having 1 to 4 carbon atoms.

Moreover, in Formula (I), $G^1$ and $G^2$ each independently represent a divalent alicyclic hydrocarbon group having 5 to 8 carbon atoms, and one or more of —$CH_2$—'s constituting the alicyclic hydrocarbon group may be substituted with —O—, —S—, or —NH—.

Furthermore, in Formula (I), $A^1$ and $A^2$ each independently represent a single bond, an aromatic ring having 6 or more carbon atoms, or a cycloalkylene ring having 6 or more carbon atoms.

Moreover, in Formula (I), $SP^1$ and $SP^2$ each independently represent a single bond, a linear or branched alkylene group having 1 to 14 carbon atoms, or a divalent linking group in which one or more of —$CH_2$—'s constituting the linear or branched alkylene group having 1 to 14 carbon atoms are substituted with —O—, —S—, —NH—, —N(Q)-, or —CO—, and Q represents a polymerizable group.

Incidentally, in Formula (I), $L^1$ and $L^2$ each independently represent a monovalent organic group (for example, an alkyl group or a polymerizable group).

In addition, in a case where Ar is a group represented by Formula (Ar-1), Formula (Ar-2), Formula (Ar-4), or Formula (Ar-5) which will be described later, at least one of $L^1$ or $L^2$ represents a polymerizable group. In addition, in a case where Ar is a group represented by Formula (Ar-3) which will be described later, at least one of $L^1$ or $L^2$, or $L^3$ or $L^4$ in Formula (Ar-3) represents a polymerizable group.

In Formula (I), a 5- or 6-membered ring is preferable as the divalent alicyclic hydrocarbon group having 5 to 8 carbon atoms represented by each of $G^1$ and C2. Further, the alicyclic hydrocarbon group may be either a saturated alicyclic hydrocarbon group or an unsaturated alicyclic hydrocarbon group, but is preferably the saturated alicyclic hydrocarbon group. With respect to the divalent alicyclic hydrocarbon group represented by each of $G^1$ and $G^2$, reference can be made to, for example, the description in paragraph 0078 of JP2012-21068A, the contents of which are incorporated herein by reference.

In Formula (I), examples of the aromatic ring having 6 or more carbon atoms represented by each of $A^1$ and $A^2$ include aromatic hydrocarbon rings such as a benzene ring, a naphthalene ring, an anthracene ring, and a phenanthroline ring; and aromatic heterocyclic rings such as a furan ring, a pyrrole ring, a thiophene ring, a pyridine ring, a thiazole ring, and a benzothiazole ring. Among those, the benzene ring (for example, a 1,4-phenyl group) is preferable.

Furthermore, in Formula (I), examples of the cycloalkylene ring having 6 or more carbon atoms represented by each of $A^1$ and $A^2$ include a cyclohexane ring and a cyclohexene ring, and among these, the cyclohexane ring (for example, a cyclohexane-1,4-diyl group) is preferable.

In Formula (I), as the linear or branched alkylene group having 1 to 14 carbon atoms represented by each of $SP^1$ and $SP^2$, a methylene group, an ethylene group, a propylene group, or a butylene group is preferable.

In Formula (I), the polymerizable group represented by each of $L^1$ and $L^2$ is not particularly limited, but a radically polymerizable group (a group which is radically polymerizable) or a cationically polymerizable group (a group which is cationically polymerizable) is preferable.

A suitable range of the radically polymerizable group is as described above.

On the other hand, in Formula (I), Ar represents any aromatic ring selected from the group consisting of groups represented by Formulae (Ar-1) to (Ar-7). In addition, in Formulae (Ar-1) to (Ar-7), *1 represents a bonding position with $D^1$ and *2 represents a bonding position with $D^2$.

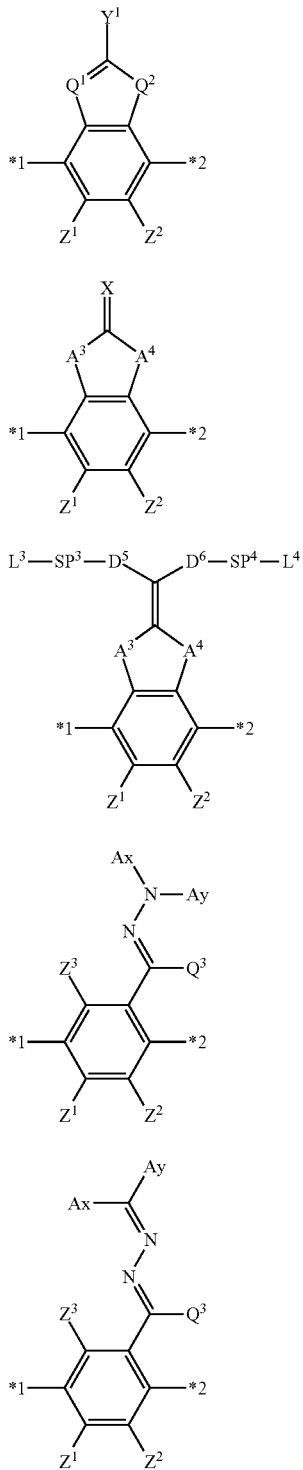

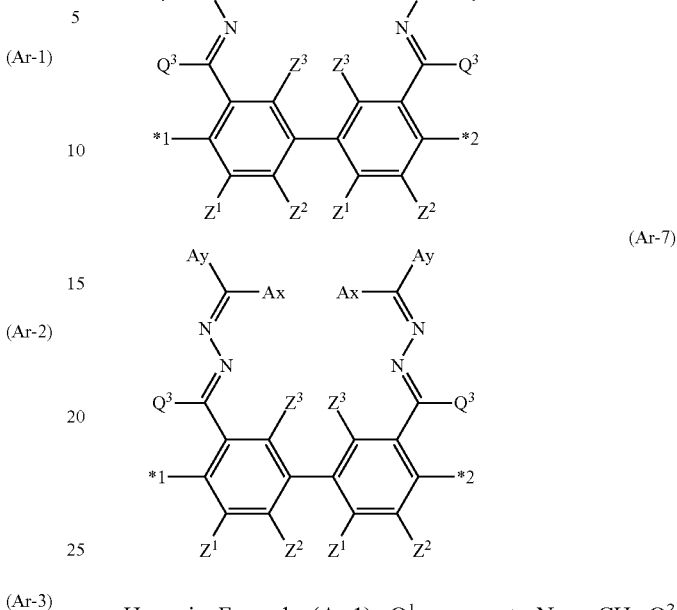

Here, in Formula (Ar-1), $Q^1$ represents N or CH, $Q^2$ represents —S—, —O—, or —N($R^5$)—, $R^5$ represents a hydrogen atom or an alkyl group having 1 to 6 carbon atoms, and $Y^1$ represents an aromatic hydrocarbon ring group having 6 to 12 carbon atoms or an aromatic heterocyclic group having 3 to 12 carbon atoms, each of which may have a substituent.

Examples of the alkyl group having 1 to 6 carbon atoms represented by $R^5$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon ring group having 6 to 12 carbon atoms represented by $Y^1$ include aryl groups such as a phenyl group, a 2,6-diethylphenyl group, and a naphthyl group.

Examples of the aromatic heterocyclic group having 3 to 12 carbon atoms represented by $Y^1$ include heteroaryl groups such as a thienyl group, a thiazolyl group, a furyl group, a pyridyl group, and a benzofuryl group. Further, examples of the aromatic heterocyclic group further include a group formed by fusion of a benzene ring and an aromatic heterocyclic ring.

In addition, examples of the substituent which may be contained in $Y^1$ include an alkyl group, an alkoxy group, a nitro group, an alkylsulfonyl group, an alkyloxycarbonyl group, a cyano group, and a halogen atom.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the halogen atom include a fluorine atom, a chlorine atom, a bromine atom, and an iodine atom, and the fluorine atom or the chlorine atom is preferable.

In addition, in Formulae (Ar-1) to (Ar-7), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon ring group having 6 to 20 carbon atoms, a halogen atom, a cyano group, a nitro group, —$NR^6R^7$, or —$SR^1$, $R^6$ to $R^8$ each independently represent a hydrogen atom or an alkyl group having 1 to 6 carbon atoms, and $Z^1$ and 2 may be bonded to each other to form a ring. The ring may be any of an alicyclic ring, a heterocyclic ring, and an aromatic ring, and is preferably the aromatic ring. In addition, a ring thus formed may be substituted with a substituent.

As the monovalent aliphatic hydrocarbon group having 1 to 20 carbon atoms, an alkyl group having 1 to 15 carbon atoms is preferable, an alkyl group having 1 to 8 carbon atoms is more preferable, a methyl group, an ethyl group, an isopropyl group, a tert-pentyl group (1,1-dimethylpropyl group), a tert-butyl group, or a 1,1-dimethyl-3,3-dimethyl-butyl group is still more preferable, and the methyl group, the ethyl group, or the tert-butyl group is particularly preferable.

Examples of the monovalent alicyclic hydrocarbon group having 3 to 20 carbon atoms include a monocyclic saturated hydrocarbon group such as a cyclopropyl group, a cyclobutyl group, a cyclopentyl group, a cyclohexyl group, a cycloheptyl group, a cyclooctyl group, a cyclodecyl group, a methylcyclohexyl group, and ethylcyclohexyl group; a monocyclic unsaturated hydrocarbon group such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene group; and a polycyclic saturated hydrocarbon group such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, and an adamantyl group.

Examples of the monovalent aromatic hydrocarbon ring group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Examples of the halogen atom include a fluorine atom, a chlorine atom, a bromine atom, and an iodine atom, and the fluorine atom, the chlorine atom, or the bromine atom is preferable.

On the other hand, examples of the alkyl group having 1 to 6 carbon atoms represented by each of $R^6$ to $R^8$ include a methyl group, an ethyl group, a propyl group, an isopropyl group, an n-butyl group, an isobutyl group, a sec-butyl group, a tert-butyl group, an n-pentyl group, and an n-hexyl group.

In addition, in Formulae (Ar-2) and (Ar-3), $A^3$ and $A^4$ each independently represent a group selected from the group consisting of —O—, —N($R^9$)—, —S—, and —CO—, and $R^9$ represents a hydrogen atom or a substituent.

Examples of the substituent represented by $R^9$ include the same ones as the substituents which may be contained in $Y^1$ in Formula (Ar-1).

Furthermore, in Formula (Ar-2), X represents a hydrogen atom or a non-metal atom of Groups 14 to 16 to which a substituent may be bonded.

Moreover, examples of the non-metal atom of Groups 14 to 16 represented by X include an oxygen atom, a sulfur atom, a nitrogen atom having a substituent, and a carbon atom having a substituent, and examples of the substituent include the same ones as the substituents which may be contained in $Y^1$ in Formula (Ar-1).

In addition, in Formula (Ar-3), $D^5$ and $D^6$ each independently represent a single bond, —O—CO—, —C(=S)O—, —$CR^1R^2$—, —$CR^1R^2$—$CR^3R^1$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—. $R^1$, $R^2$, $R^3$, and $R^4$ each independently represent a hydrogen atom, a fluorine atom, or an alkyl group having 1 to 4 carbon atoms.

Moreover, in Formula (Ar-3), $SP^3$ and $SP^4$ each independently represent a single bond, a linear or branched alkylene group having 1 to 12 carbon atoms, or a divalent lining group in which one or more of —$CH_2$—'s constituting the linear or branched alkylene group having 1 to 12 carbon atoms are substituted with —O—, —S—, —NH—, —N(Q)-, or —CO—, and Q represents a polymerizable group.

Furthermore, in Formula (Ar-3), $L^3$ and $L^4$ each independently represent a monovalent organic group (for example, an alkyl group and a polymerizable group), and at least one of $L^3$ or $L^4$, or $L^1$ or $L^2$ in Formula (1) represents a polymerizable group.

Moreover, in Formulae (Ar-4) and (Ar-7), Ax represents an organic group having 2 to 30 carbon atoms, which has at least one aromatic ring selected from the group consisting of an aromatic hydrocarbon ring and an aromatic heterocyclic ring.

Furthermore, in Formulae (Ar-4) to (Ar-7), Ay represents a hydrogen atom, an alkyl group having 1 to 6 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, $Q^3$ represents a hydrogen atom or an alkyl group having 1 to 6 carbon atoms, which may have a substituent.

Examples of Ax and Ay include those described in paragraphs 0039 to 0095 of WO2014/010325A.

Incidentally, examples of the alkyl group having 1 to 6 carbon atoms represented by $Q^3$ include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same ones as the substituents which may be contained in $Y^1$ in Formula (Ar-1).

Among those, from the viewpoint that the effect of the present invention is more excellent, it is preferable that at least one of $A^1$ or $A^2$ is a cycloalkylene ring having 6 or more carbon atoms, and it is more preferable that one of $A^1$ and $A^2$ is a cycloalkylene ring having 6 or more carbon atoms.

The content of the liquid crystal compound in the composition is not particularly limited, but is preferably 50% by mass or more, and more preferably 70% by mass or more with respect to the total solid content in the composition. An upper limit thereof is not particularly limited, but is often 90% by mass or less.

In addition, the total solid content in the composition does not include a solvent. That is, the solid content means a component obtained by removing the solvent from the composition.

Furthermore, the composition may further include a forward wavelength dispersible liquid crystal compound. The forward wavelength dispersible liquid crystal compound means a compound in which an optically anisotropic film formed using the compound exhibits forward wavelength dispersibility. That is, the forward wavelength dispersible liquid crystal compound means a compound in which the in-plane retardation of an optically anisotropic film formed using the compound decreases as the measurement wavelength increases.

Addition of a forward wavelength dispersible liquid crystal compound makes it possible to adjust the wavelength dispersion of a composition and impart wavelength dispersibility closer to ideal wavelength dispersion.

<Polymer>

The type of the polymer is not particularly limited, but is preferably a reverse wavelength dispersible polymer. The reverse wavelength dispersible polymer means a polymer which is used to form an optically anisotropic film exhibiting reverse wavelength dispersibility.

One of suitable aspects of the polymer may be a polymer including one or more repeating units selected from the group consisting of a repeating unit represented by Formula (7) and a repeating unit represented by Formula (8).

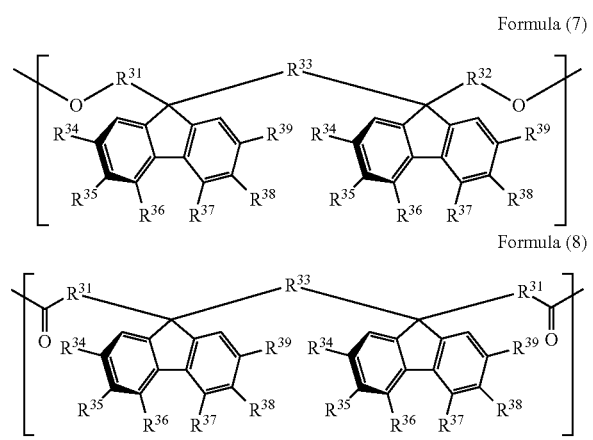

Formula (7)

Formula (8)

In Formulae (7) and (8), $R^{31}$ to $R^{33}$ each independently represent a single bond, or an alkylene group having 1 to 4 carbon atoms, which may have a substituent.

$R^{34}$ to $R^{39}$ each independently represent a hydrogen atom, an alkyl group having 1 to 10 carbon atoms, which may have a substituent, an aryl group having 4 to 10 carbon atoms, which may have a substituent, a heteroaryl group having 4 to 10 carbon atoms, which may have a substituent, an acyl group having 1 to 10 carbon atoms, which may have a substituent, an alkoxy group having 1 to 10 carbon atoms, which may have a substituent, an aryloxy group having 1 to 10 carbon atoms, which may have a substituent, an acyloxy group having 1 to 10 carbon atoms, which may have a substituent, an amino group which may have a substituent, a vinyl group having 1 to 10 carbon atoms, which may have a substituent, an ethynyl group having 1 to 10 carbon atoms, which may have a substituent, a sulfur atom having a substituent, a silicon atom having a substituent, a halogen atom, a nitro group, or a cyano group. It should be noted that at least two adjacent groups of $R^{34}$, . . . , or $R^{39}$ may be bonded to each other to form a ring.

In addition, each two of $R^{34}$'s, $R^{35}$'s, $R^{36}$'s, $R^{37}$'s, $R^{38}$'s, and $R^{39}$'s included in Formula (7) may be the same as or different from each other. Similarly, each two of $R^{34}$'s, $R^{35}$'s, $R^{36}$'s, $R^{37}$'s, $R^{38}$'s, and $R^{39}$'s included in Formula (8) may be the same as or different from each other.

Other suitable aspects of the polymer include a polymer including a repeating unit of Formula (9) and a repeating unit of Formula (11).

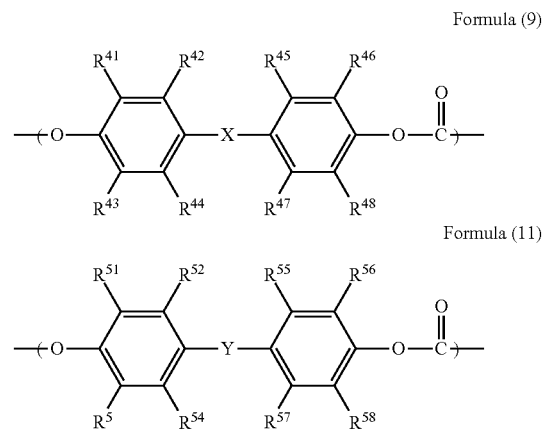

Formula (9)

Formula (11)

In Formula (9), $R^{41}$ to $R^{48}$ each independently represent a hydrogen atom, a halogen atom, or a hydrocarbon group having 1 to 6 carbon atoms.

X represents a group represented by Formula (10). In Formula (10), * represents a bonding position.

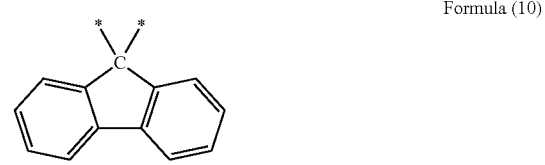 [SMILES: *C1(*)c2ccccc2-c2ccccc21]

Formula (10)

In Formula (11), $R^{51}$ to $R^{58}$ each independently represent a hydrogen atom, a halogen atom, or a hydrocarbon group having 1 to 22 carbon atoms.

Y represents —C($R^{61}$)($R^{62}$)—, a group represented by Formula (12), —Si($R^{67}$)($R^{68}$)—, —SO$_2$—, —S—, a divalent aliphatic hydrocarbon group, —C(CH$_3$)$_2$-phenylene group-C(CH$_3$)$_2$—, —CO—O-L-O—CO—.

In Formula (12), * represents a bonding position.

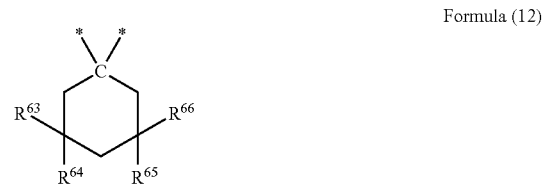

Formula (12)

or a hydrocarbon group having 1 to 22 carbon atoms (for example, an aryl group having 6 to 10 carbon atoms).

$R^{63}$ to $R^{11}$ each independently represent a hydrogen atom or an alkyl group.

L represents a divalent aliphatic hydrocarbon group.

The content of the repeating unit represented by Formula (9) in the polymer is not particularly limited, but is preferably 30% to 90% by mole with respect to all the repeating units.

The content of the repeating unit represented by Formula (11) in the polymer is not particularly limited, but is preferably 10% to 70% by mole with respect to all the repeating units.

Other suitable aspects of the polymer include cellulose acylate.

As the cellulose acylate, a lower fatty acid ester of cellulose is preferable. The lower fatty acid means a fatty acid having 6 or less carbon atoms. The fatty acid preferably has 2 carbon atoms (cellulose acetate), 3 carbon atoms (cellulose propionate), or 4 carbon atoms (cellulose butyrate). In addition, mixed fatty acid esters such as cellulose acetate propionate and cellulose acetate butyrate may be used.

The acetylation degree of cellulose acetate is preferably 55.0% to 62.5%, more preferably 57.0% to 62.0%, and still more preferably 58.5% to 61.5%.

The acetylation degree means an amount of bonded acetic acid per unit mass of cellulose. The acetylation degree follows the measurement and computation of the acetylation degree in ASTM: D-817-91 (a test method for cellulose acetate and the like).

Furthermore, in a case where cellulose acylate is used as the polymer, additives such as a plasticizer, a deterioration inhibitor, a retardation enhancer, and an ultraviolet absorber may be used in combination.

Examples of the additive include those exemplified in JP2004-050516A.

The content of the polymer in the composition is not particularly limited, but is preferably 50% by mass or more, and more preferably 70% by mass or more with respect to the total solid content in the composition. An upper limit thereof is not particularly limited, but is often 90% by mass or less.

In addition, the total solid content in the composition does not include a solvent.

<Other Components>

The composition may include components other than the above-mentioned liquid crystal compound, polymer, and coloring agent.

The composition may include a polymerization initiator. The polymerization initiator to be used is selected according to the type of a polymerization reaction, and examples thereof include a thermal polymerization initiator and a photopolymerization initiator. Examples of the photopolymerization initiator include an α-carbonyl compound, an acyloin ether, an α-hydrocarbon substituted aromatic acyloin compound, a polynuclear quinone compound, and a combination of a triarylimidazole dimer and a p-aminophenyl ketone.

The content of the polymerization initiator in the composition is preferably 0.01% to 20% by mass, and more preferably 0.5% to 10% by mass with respect to the total solid content of the composition.

In addition, the composition may include a polymerizable monomer.

Examples of the polymerizable monomer include a radically polymerizable or cationically polymerizable compound. Among those, a polyfunctional radically polymerizable monomer is preferable. In addition, as the polymerizable monomer, a monomer which is copolymerizable with the liquid crystal compound having a polymerizable group is preferable. Examples of the polymerizable monomer include those described in paragraphs 0018 to 0020 of JP2002-296423A.

The content of the polymerizable monomer in the composition is preferably 1% to 50% by mass, and more preferably 2% to 30% by mass with respect to the total mass of the liquid crystal compound.

Moreover, the composition may include a surfactant.

Examples of the surfactant include compounds known in the related art, but a fluorine-based compound is preferable. Examples of the compound include the compounds described in paragraphs 0028 to 0056 of JP2001-330725A and the compounds described in paragraphs 0069 to 0126 of JP2003-295212A.

Furthermore, the composition may include a solvent. As the solvent, an organic solvent is preferable. Examples of the organic solvent include an amide (for example, N,N-dimethylformamide), a sulfoxide (for example, dimethyl sulfoxide), a heterocyclic compound (for example, pyridine), a hydrocarbon (for example, benzene and hexane), an alkyl halide (for example, chloroform and dichloromethane), an ester (for example, methyl acetate, ethyl acetate, and butyl acetate), a ketone (for example, acetone and methyl ethyl ketone), and an ether (for example, tetrahydrofurm and 1,2-dimethoxyethane). In addition, two or more kinds of the organic solvents may be used in combination.

Moreover, the composition may include various alignment control agents such as a vertical alignment agent and a horizontal alignment agent. Such an alignment control agent is a compound capable of controlling the horizontal or vertical alignment of a liquid crystal compound at an interface.

In addition, the composition may include an adhesion improver and a plasticizer, in addition to the components.

<Production Method>

A method for producing the optically anisotropic film of the embodiment of the present invention is not particularly limited and examples thereof include known methods.

Among those, from the viewpoint that the in-plane retardation is easily controlled, a method in which a composition including a polymerizable liquid crystal compound and a coloring agent capable of forming a J-aggregate is applied to form a coating film, the coating film is subjected to an alignment treatment to align the polymerizable liquid crystal compound, and the obtained coating film is subjected to a curing treatment (irradiation with ultraviolet rays (light irradiation treatment) or a heating treatment) to form an optically anisotropic film is preferable.

Hereinafter, the procedure of the method will be described in detail.

First, the composition is applied onto a support to form a coating film and the coating film is subjected to an alignment treatment to align the polymerizable liquid crystal compound. The conditions under which a J-aggregate is formed often differ depending on the structure of a coloring agent and the blending composition of a composition. Above all, it is preferable to form a J-aggregate during or after the alignment of a polymerizable liquid crystal compound. For example, a J-aggregate may be formed upon alignment of a polymerizable liquid crystal compound by heating, and then cooling.

The composition to be used includes a polymerizable liquid crystal compound. The definition of the polymerizable liquid crystal compound is the same as mentioned above.

The support to be used is a member having a function as a base material for applying a composition thereon. The support may be a temporary support which is peeled after applying the composition and performing curing.

As the support (temporary support), a glass substrate may be used, in addition to a plastic film. Examples of a material constituting the plastic film include a polyester resin such as polyethylene terephthalate, a polycarbonate resin, a (meth) acryl resin, an epoxy resin, a polyurethane resin, a polyamide resin, a polyolefin resin, a cellulose derivative, a silicone resin, and polyvinyl alcohol (PVA).

The thickness of the support only needs to be about 5 to 1,000 µm, and is preferably 10 to 250 µm, and more preferably 15 to 90 µm.

Moreover, an alignment layer may be arranged on the support, as desired.

The alignment layer generally includes a polymer as a main component. Polymer materials for an alignment layer are described in many documents and a large number of commercially available products thereof can be obtained. As the polymer material for an alignment layer, polyvinyl alcohol, polyimide, or a derivative thereof is preferable.

In addition, it is preferable that the alignment layer is subjected to a known rubbing treatment.

The thickness of the alignment layer is preferably 0.01 to 10 µm, and more preferably 0.01 to 1 µm.

Examples of a method for applying the composition include a curtain coating method, a dip coating method, a spin coating method, a printing coating method, a spray coating method, a slot coating method, a roll coating method, a slide coating method, a blade coating method, a gravure coating method, and a wire bar method. A single layer coating is preferable in a case of performing coating by any of these methods.

The coating film formed on the support is subjected to an alignment treatment to align the polymerizable liquid crystal compound in the coating film.

The alignment treatment can be performed by drying the coating film at room temperature or heating the coating film. In a case of a thermotropic liquid crystal compound, a liquid crystal phase formed with the alignment treatment can generally be transferred by a change in a temperature or pressure. In a case of a lyotropic liquid crystal compound, the liquid crystal phase can also be transferred according to a compositional ratio such as the amount of a solvent.

Furthermore, the condition in a case of heating the coating film is not particularly limited, but the heating temperature is preferably 50° C. to 250° C., and more preferably 150° C. to 230° C., and the heating time is preferably 10 seconds to 10 minutes.

Moreover, before performing a curing treatment (light irradiation treatment) which will be described later, after heating the coating film, the coating film may be cooled, as desired. The cooling temperature is preferably 20° C. to 200° C., and more preferably 30° C. to 150° C.

Next, the coating film in which the polymerizable liquid crystal compound has been aligned is subjected to a curing treatment.

A method for the curing treatment to be carried out on the coating film in which the polymerizable liquid crystal compound has been aligned is not particularly limited, and examples thereof include a light irradiation treatment and a heating treatment. Among those, from the viewpoint of manufacturing suitability, the light irradiation treatment is preferable, and an ultraviolet ray-irradiation treatment is more preferable.

An irradiation condition for the light irradiation treatment is not particularly limited, but an irradiation dose of 50 to 1,000 mJ/cm$^2$ is preferable.

In the production method, by adjusting various conditions, the arrangement state of the coloring agent, and the like can be adjusted, and as a result, the optical characteristics of the optically anisotropic film can be adjusted.

For example, by adjusting a heating temperature during alignment of the liquid crystal compound after applying a composition onto the support to form a coating film and a cooling temperature during cooling after heating, the arrangement state of the coloring agent, and the like can be adjusted, and as a result, the optical characteristics of the optically anisotropic film can be adjusted.

In addition, although an aspect in which the J-aggregate is formed during formation of the optically anisotropic film has been described above, the present invention is not limited to this aspect, and an optically anisotropic film may be formed by the method, using a composition including a J-aggregate, which has been separately synthesized in advance, and a polymerizable liquid crystal compound.

Other aspects of the method for producing the optically anisotropic film of the embodiment of the present invention include a method in which an unstretched film is formed using a composition including a polymer and a coloring agent capable of forming a J-aggregate, and the obtained unstretched film is stretch-aligned to form an optically anisotropic film.

Examples of a method for forming an unstretched film include a method in which a composition including a polymer, a coloring agent, and a solvent is applied, and then the solvent is removed to form an unstretched film, and a method in which solid contents including a polymer and a coloring agent are molten without using a solvent to prepare a film.

Examples of the stretching method include known methods such as longitudinal uniaxial stretching, horizontal uniaxial stretching, or a combination thereof such as simultaneous biaxial stretching or sequential biaxial stretching.

The J-aggregate may be formed in an unstretched film or may be formed during stretching.

(Uses)

The above-mentioned optically anisotropic film can be applied to various uses, and it can also be used as, for example, a so-called $\lambda/4$ plate or $\lambda/2$ plate by adjusting the in-plane retardation of the optically anisotropic film.

Furthermore, the $\lambda/4$ plate is a plate having a function of converting linearly polarized light having a specific wavelength into circularly polarized light (or converting circularly polarized light into linearly polarized light). More specifically, the $\lambda/4$ plate is a plate in which an in-plane retardation Re at a predetermined wavelength of $\lambda$ nm is $\lambda/4$ (or an odd number of times thereof).

The in-plane retardation (Re(550)) of the $\lambda/4$ plate at a wavelength of 550 nm may have an error of about 25 nm from an ideal value (137.5 nm) at a center, and is, for example, preferably 110 to 160 nm, and more preferably 120 to 150 nm.

In addition, the $\lambda/2$ plate is an optically anisotropic film in which the in-plane retardation Re($\lambda$) at a specific wavelength of $\lambda$ nm satisfies Re($\lambda$)≈$\lambda/2$. This formula only needs to be satisfied at any wavelength (for example, 550 nm) in the visible region. Above all, it is preferable that the in-plane retardation Re(550) at a wavelength of 550 nm satisfies the following relationship.

210 nm≤Re(550)≤300 nm

Another layer may be further arranged on the optically anisotropic film. Examples of the other layer include a gas barrier layer. That is, a form of a laminate (hereinafter also referred to as a "specific laminate") including an optically anisotropic film and a gas barrier layer arranged on the optically anisotropic film may also be used. By arranging the gas barrier layer, the light resistance of the optically anisotropic film is improved.

The gas barrier layer is intended to be a layer through which gas does not easily pass, and is preferably an oxygen barrier layer. Further, the oxygen barrier is intended to be a layer having an oxygen permeability of 10 mL/m²·day·atm or less, and the oxygen permeability is preferably 1 mL/m²·day·atm. A lower limit thereof is not particularly limited, but is often 10 mL/m²·day·atm or more.

Examples of the gas barrier layer include a polyvinyl alcohol layer (a layer including polyvinyl alcohol), an ethylene-vinyl alcohol copolymer (EVOH) layer (a layer including EVOH), and an inorganic deposition layer.

The optically anisotropic film and the specific laminate may be included in a display device. That is, examples of more specific uses of the optically anisotropic film include an optical compensation film for optical compensation of a liquid crystal cell, and an antireflection film for use in a display device such as an organic electroluminescence display device.

Among those, preferred aspects of the optical film include a circularly polarizing plate which includes an optically anisotropic film or a specific laminate, and a polarizer. This circularly polarizing plate can be suitably used as the antireflection film. That is, it is possible to further suppress a reflection tint in a display device including a display element (for example, an organic electroluminescence display element) and a circularly polarizing plate arranged on the display element.

Furthermore, the optically anisotropic film of the embodiment of the present invention is suitably used in an optical compensation film of an in plane switching (IPS) type liquid crystal display device, and can improve a tint change as viewed from a tilt direction and a light leakage upon black display.

Examples of the optical film including the optically anisotropic film include a circularly polarizing plate including a polarizer and an optically anisotropic film, as described above.

The polarizer only needs to be a member (linear polarizer) having a function of converting light into specific linearly polarized light, and an absorptive type polarizer can be usually used.

Examples of the absorptive type polarizer include an iodine-based polarizer, a dye-based polarizer using a dichroic dye, and a polyene-based polarizer. The iodine-based polarizer and the dye-based polarizer are classified into a coating type polarizer and a stretching type polarizer, both of which can be applied, but a polarizer which is manufactured by allowing polyvinyl alcohol to adsorb iodine or a dichroic dye and performing stretching is preferable.

A relationship between the absorption axis of the polarizer and the slow axis of the optically anisotropic film is not particularly limited, but in a case where the optically anisotropic film is a λ/4 plate and the optical film is used as a circularly polarizing film, an angle formed between the absorption axis of the polarizer and the slow axis of the optically anisotropic film is preferably 450 t 100.

EXAMPLES

Hereinafter, the features of the present invention will be described in more details with reference to Examples and Comparative Examples. The materials, the amounts of materials used, the proportions, the treatment details, the treatment procedure, and the like shown in Examples below can be appropriately modified as long as the modifications do not depart from the spirit of the present invention. Therefore, the scope of the present invention should not be construed as being limited to specific examples shown below.

<Synthesis of Coloring Agent>

(Synthesis of Coloring Agent D-1)

A coloring agent D-1 was synthesized according to the following scheme.

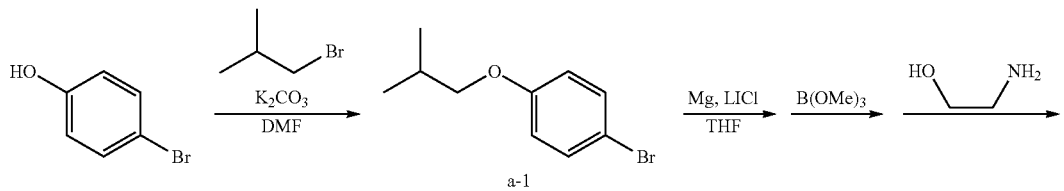

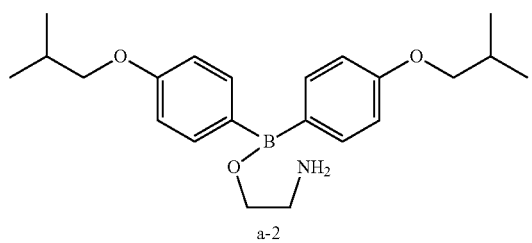

-continued
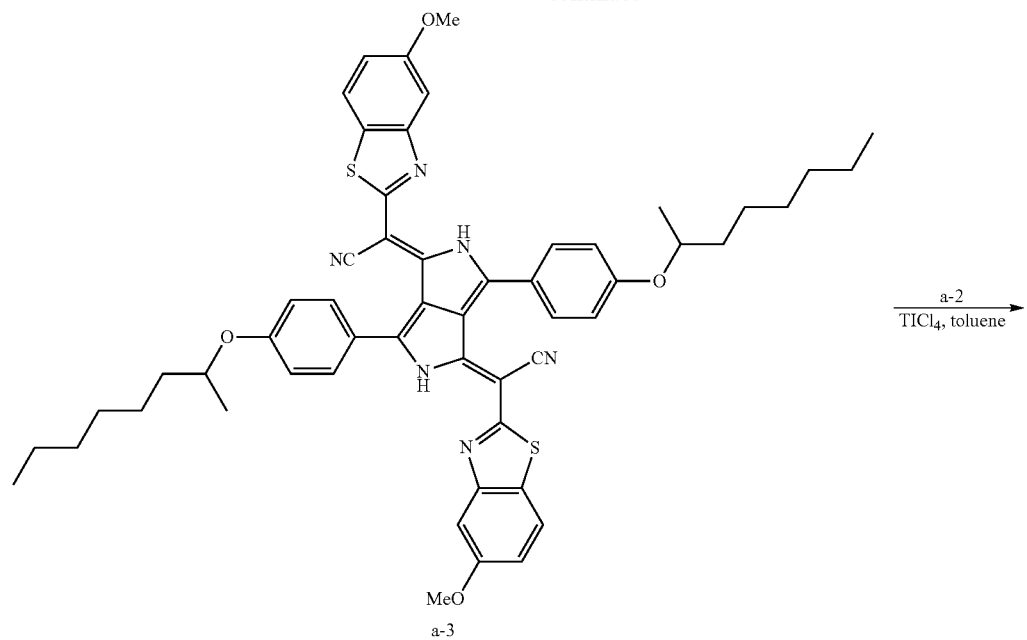
a-3
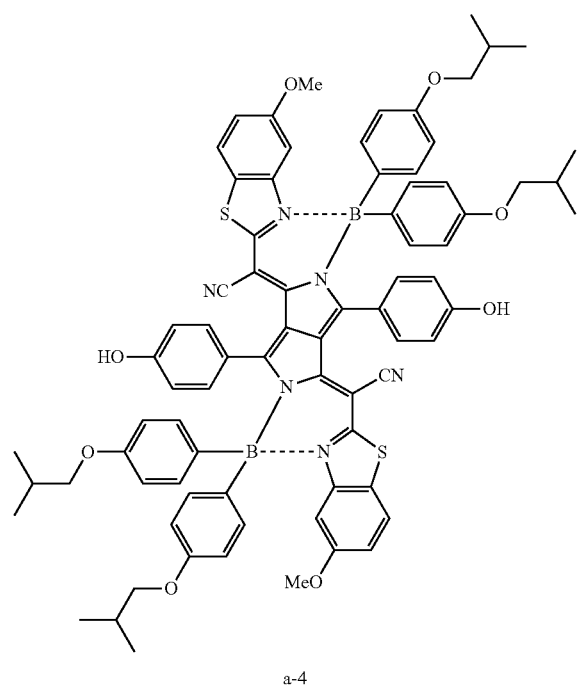
a-4
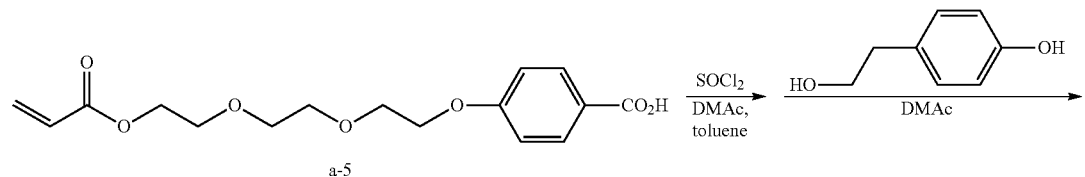
a-5
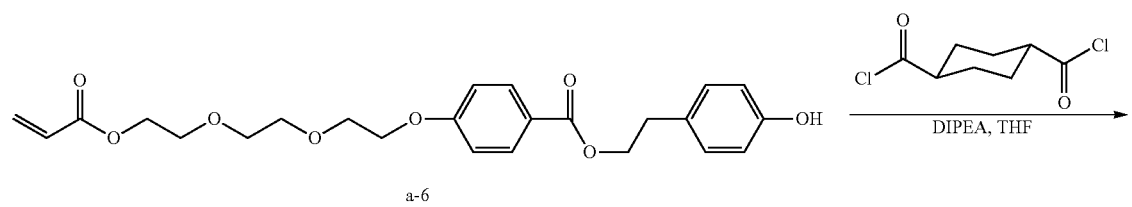
a-6

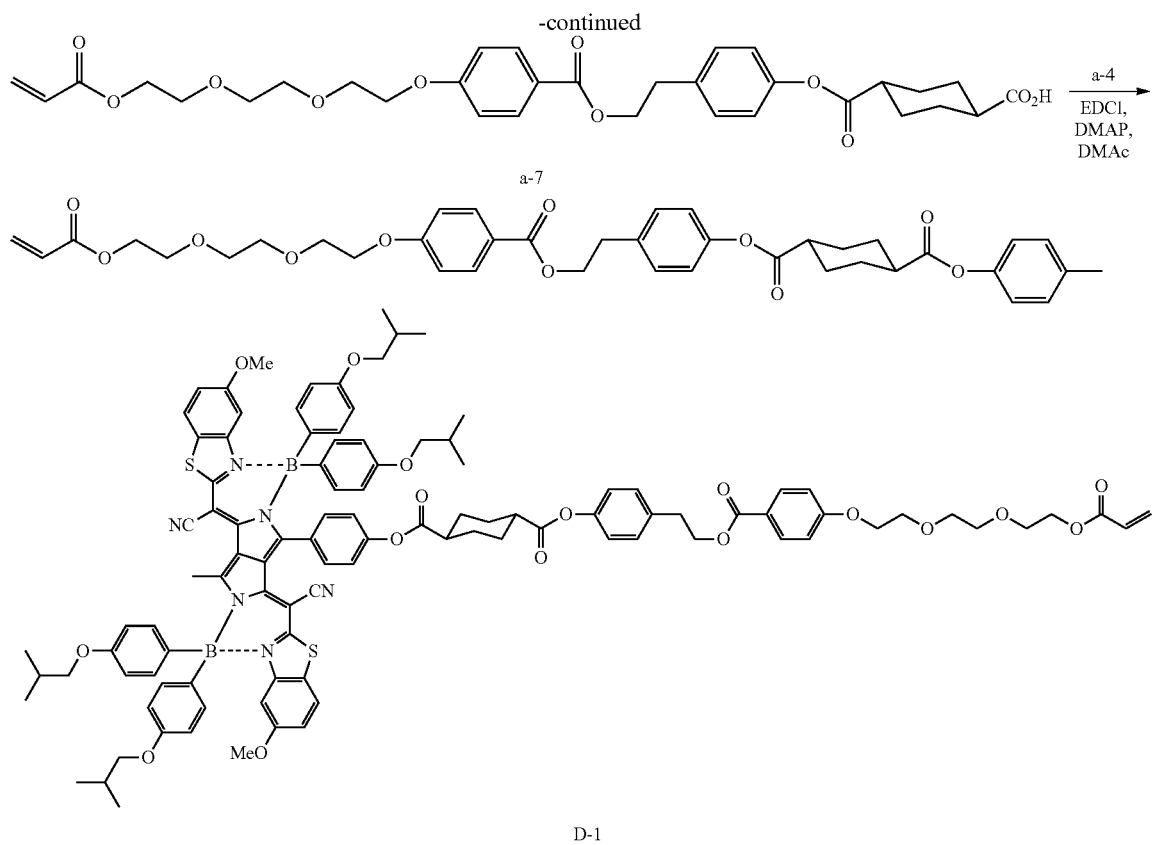

(Synthesis of Compound a-1)

4-Bromophenol (50.0 g, 258 mmol), 1-bromo-2-methylpropane (59.4 g, 433 mmol), potassium carbonate (104 g, 751 mmol), and N,N-dimethylformamide (250 ml) were mixed at room temperature. The temperature of the obtained mixture was raised to 105° C., the mixture was stirred for 10 hours, then the temperature was lowered to room temperature, and the inorganic salts were filtered from the mixed solution. Ethyl acetate (300 ml) and 1 N aqueous hydrochloric acid (300 ml) were added to the obtained mixed solution to perform liquid separation extraction. The organic layer was washed with distilled water (300 ml) and a saturated aqueous sodium bicarbonate solution (300 ml), and the obtained organic layer was dried over magnesium sulfate. Thereafter, magnesium sulfate was removed from the obtained solution by filtration, and the solvent was evaporated from the solution under reduced pressure. The obtained crude product was purified by silica gel column chromatography using ethyl acetate-hexane as a solvent to obtain an oily compound a-1 (49.5 g, 216 mmol) (yield: 74%).

(Synthesis of Compound a-2)

Magnesium (3.75 g, 154 mmol), lithium chloride (3.27 g, 105 mmol), and tetrahydrofuran (160 ml) were mixed at room temperature under a dry nitrogen atmosphere. The temperature of the obtained mixed solution was raised to 63° C., and a mixture of the compound a-1 (32.1 g, 140 mmol) and tetrahydrofuran (40 ml) was added dropwise thereto. The obtained mixed solution was cooled to room temperature, and then a mixture of trimethoxyborane (7.28 g, 70.1 mmol) and tetrahydrofuran (20 ml) was added dropwise thereto. The temperature of the obtained mixed solution was raised to 50° C., the mixed solution was stirred for 2 hours, and then the temperature was lowered to room temperature. Distilled water (20 ml) was added to the obtained mixed solution, and then ethyl acetate (200 ml) and 1 N aqueous hydrochloric acid (200 ml) were added thereto to perform a liquid separation extraction. The organic layer was washed twice with saturated brine (200 ml), and the obtained organic layer was dried over magnesium sulfate. Thereafter, magnesium sulfate was removed from the obtained solution by filtration, and the solvent was evaporated from the solution under reduced pressure. The obtained crude product was purified by silica gel column chromatography using ethyl acetate-hexane as a solvent. Toluene (100 ml) and ethanolamine (6.42 g, 105 mmol) were added to the obtained crude product, and the mixture was stirred at room temperature for 10 minutes. The solvent and excess ethanolamine were evaporated under reduced pressure to obtain a compound a-2 (6.45 g, 17.5 mmol) in the form of a white solid (yield: 25%).

(Synthesis of Compound a-3)

A compound (pyrrolopyrrole) a-3 was synthesized according to the method for synthesizing a compound A-15-c described in paragraphs 0271 and 0272 of WO2017/146092A.

(Synthesis of Compound a-4)

A compound (pyrrolopyrrole boron complex) a-4 was synthesized according to the method for synthesizing a compound A-15 described in paragraphs 0271 and 0272 of WO2017/146092A. The pyrrolopyrrole boron complex a-4 can be synthesized by using the compound a-2 instead of the diphenylborinic acid 2-aminoethyl ester in the method for synthesizing A-15.

(Synthesis of Compound a-5)

A compound a-5 was synthesized according to the method for synthesizing a compound P1-1 described in paragraphs 0088 to 0091 of WO2018/124198A.

(Synthesis of Compound a-6)

The compound a-5 (10.0 g, 30.8 mmol), 2,2,6,6-tetramethylpiperidin-1-oxyl (12.0 mg, 0.77 mmol), toluene (20 ml), and N,N-dimethylacetamide (5.5 ml) were mixed at room temperature. The obtained mixed solution was cooled to −5° C., and thionyl chloride (3.52 g, 29.6 mmol) was added dropwise to the mixed solution. The obtained mixed solution was stirred at an internal temperature of −5° C. to 3° C. for 1 hour, and then a mixture of 2-(4-hydroxyphenyl)ethanol (3.55 g, 25.7 mmol) and N,N-dimethylacetamide (13.0 ml) was added dropwise thereto. The temperature of the obtained mixed solution was raised to 52° C., the mixed solution was stirred for 7 hours, and then the temperature was lowered to room temperature. Distilled water and toluene were added to the mixed solution to perform liquid separation extraction. The organic layer was washed with 1 N aqueous hydrochloric acid, then washed twice with a saturated aqueous sodium bicarbonate solution, and further washed with saturated saline, and the obtained organic layer was dried over magnesium sulfate. Thereafter, magnesium sulfate was removed from the obtained solution by filtration, and the solvent was evaporated from the solution under reduced pressure. The obtained crude product was purified by silica gel column chromatography using ethyl acetate-hexane as a solvent to obtain a compound a-6 (6.03 g, 13.6 mmol) in the form of a white solid (yield: 53%).

(Synthesis of Compound a-7)

The compound a-6 (4.46 g, 10.0 mmol), cyclohexanedicarboxylic acid dichloride (6.29 g, 30.0 mmol), dibutylhydroxytoluene (66.0 mg, 0.30 mmol), and tetrahydrofuran (67.0 ml) were mixed at room temperature. The obtained mixed solution was cooled to 3° C., N,N-diisopropylethylamine (2.59 g, 20.0 mmol) was added dropwise thereto, and the obtained mixed solution was stirred for 1 hour. Methanesulfonic acid (130 μl) was added to the obtained mixed solution, the insoluble matter was filtered, and then 10% aqueous potassium carbonate (12.5 g) was added thereto to perform liquid separation extraction. The organic layer was washed with 17% aqueous potassium carbonate (20.4 g), and the obtained organic layer was dried over magnesium sulfate. Thereafter, magnesium sulfate was removed from the obtained solution by filtration, and the solvent was evaporated from the solution under reduced pressure. The obtained crude product was purified by silica gel column chromatography using ethyl acetate-hexane as a solvent to obtain a compound a-7 (2.06 g, 3.43 mmol) in the form of a white solid (yield: 34.3%).

(Synthesis of Coloring Agent D-1)

The compound a-4 (1.30 g, 0.99 mmol), the compound a-7 (1.84 g, 3.08 mmol), 1-ethyl-3-(3-dimethylaminopropyl)carbodiimide hydrochloride (1.14 g, 5.96 mmol), N,N-dimethylaminopyridine (12.1 mg, 0.10 mmol), dibutylhydroxytoluene (21.9 mg, 0.10 mmol), N,N-dimethylacetamide (15 ml), and tetrahydrofuran (15 ml) were mixed at room temperature. The temperature of the obtained mixed solution was raised to 70° C., the mixed solution was stirred for 2 hours, and then the temperature was lowered to room temperature. Methanol (200 ml) was added dropwise to the obtained mixed solution, and the precipitated crystals were recovered by filtration. The obtained crude product was purified by silica gel column chromatography using ethyl acetate-chloroform as a solvent to obtain a coloring agent D-1 (0.38 g, 0.15 mmol) in the form of a green solid (yield: 16%). The structure of the coloring agent D-1 was identified by $^1$H-nuclear magnetic resonance (NMR).

$^1$H-NMR (solvent: CDCl$_3$) δ (ppm): 1.02 (m, 24H), 1.61-1.80 (m, 8H), 2.07 (m, 4H), 2.32 (m, 8H), 2.61 (m, 41H), 3.07 (t, 4H), 3.33 (s, 6H), 3.73 (m, 20H), 3.90 (m, 4H), 4.20 (m, 4l1), 4.33 (m, 4H), 4.50 (t, 4H), 5.85 (dd, 2H), 6.18 (dd, 2H), 6.45 (dd, 2H), 6.68 (m, 20H), 6.93 (m, 4H), 7.05 (m, 4H), 7.15 (m, 8H), 7.30 (m, 6H), 7.96 (m, 4H)

(Synthesis of Coloring Agent D-2)

A coloring agent D-2 was synthesized by the same method as the method for synthesizing the coloring agent D-1, using the compound A-15 described in paragraphs 0271 and 0272 of WO2017/146092A instead of the compound a-4, and using the compound I-4C described in paragraphs 0122 to 0125 of JP2016-081035A instead of the compound a-7.

Moreover, a group adjacent to the acryloyloxy group in the structural formula of the following coloring agent D-2 represents a propylene group (a group in which the methyl group is substituted with an ethylene group), and the coloring agent D-2 represents a mixture of position isomers in which the positions of the methyl groups are different (yield: 96%). The structure of the coloring agent D-2 was identified by $^1$H-NMR.

$^1$H-NMR (solvent: CDCl$_3$) δ (ppm): 1.29 (t, 6H), 1.69 (m, 8l1), 2.30 (m, 8H), 2.61 (m, 12H), 2.95 (t, 4H1), 3.29 (s, 6H), 4.10-4.32 (m, 8H), 5.20 (m, 2H), 5.85 (dd, 2H), 6.12 (ddd, 2H), 6.41 (dd, 2H), 6.59 (d, 6H), 6.68 (m, 6H), 7.01 (d, 4H), 7.20 (m, 16H), 7.30 (m, 12H)

D-2

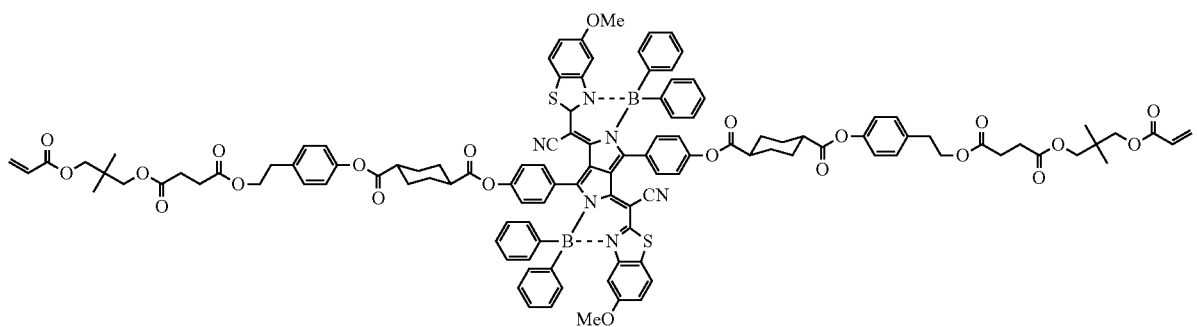

Example 1

A coating liquid 1 for an optically anisotropic film having the following composition was prepared.

| | |
|---|---|
| The following liquid crystal compound L-1 | 43 parts by mass |
| The following liquid crystal compound L-2 | 43 parts by mass |
| The following liquid crystal compound L-3 | 14 parts by mass |
| Coloring agent D-1 | 10 parts by mass |
| The following photopolymerization initiator PI-1 | 0.50 parts by mass |
| The following fluorine-containing compound F-1 | 0.20 parts by mass |
| Chloroform | 560 parts by mass |

L-1 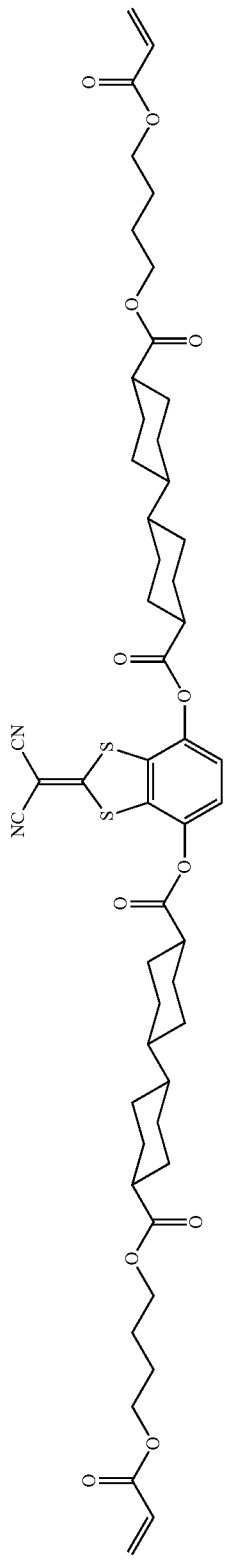 L-2 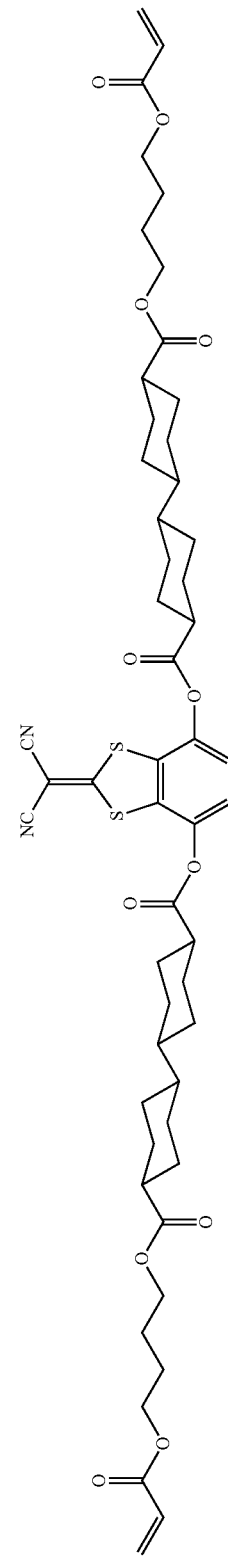 L-3 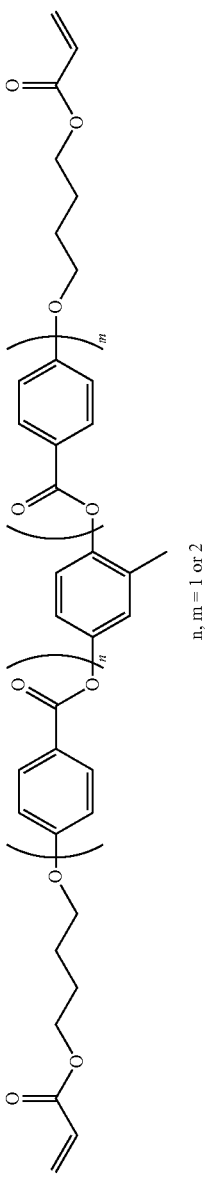
n, m = 1 or 2

-continued
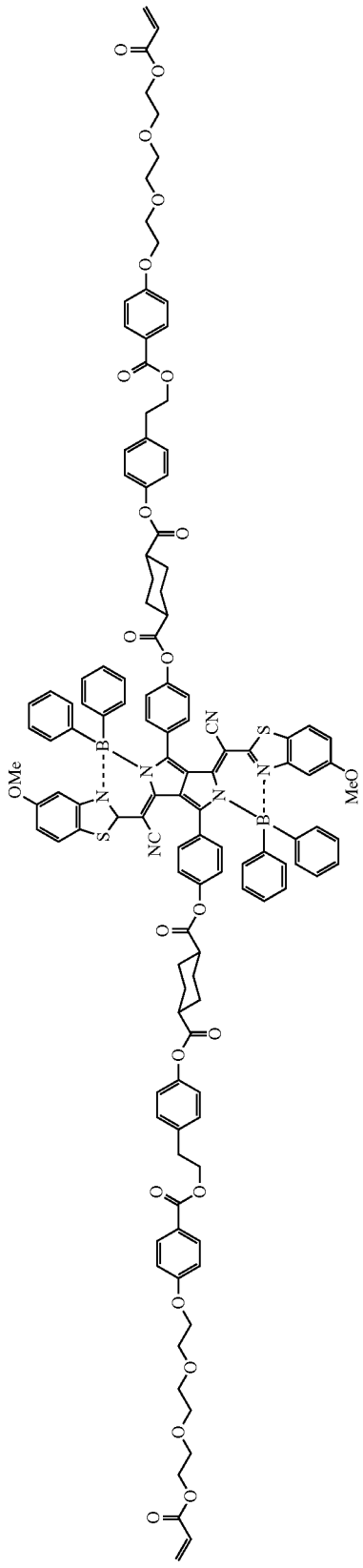
D-1
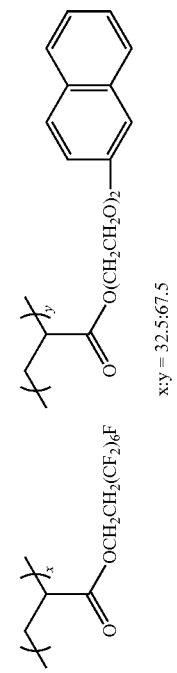
F-1
x:y = 32.5:67.5
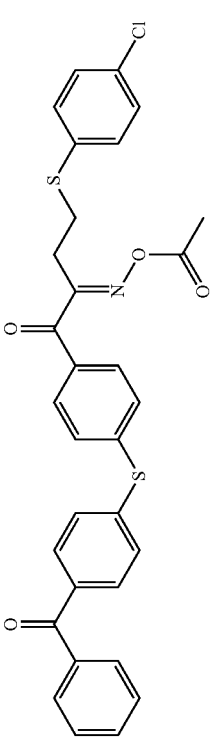
PI-1

A coating liquid 1 for an optically anisotropic film was applied onto a glass substrate with a polyimide alignment layer (SE-130, manufactured by Nissan Chemical Corporation), which had been subjected to a rubbing treatment, by spin-coating to form a coating film, which was heated at 210° C. for one minute and then rapidly cooled to 100° C. Thereafter, nitrogen purge was performed so as to create an atmosphere with an oxygen concentration of 1.0% by volume or less, and the coating film was irradiated with ultraviolet rays at an irradiation dose of 500 mJ/cm$^2$ using a high-pressure mercury lamp to manufacture an optically anisotropic film 1.

The optical characteristics of the obtained optically anisotropic film 1 were measured using AxoScan OPMF-1 (manufactured by Opto Science, Inc.), and it was thus found that Re(550) was 140 nm, Re(450)/Re(550) was 0.80, and Re(650)/Re(550) was 1.21.

In addition, in a case where absorption in the infrared region was confirmed using a spectrophotometer (MPC-3100 (manufactured by SHIMADZU Corporation)) equipped with a polarizer for infrared rays, it was confirmed that an absorption peak derived from the J-aggregate was exhibited at 868 nm. Further, it was confirmed that the absorption in a direction parallel to the fast axis of the optically anisotropic film is larger than the absorption in a direction parallel to the slow axis at a wavelength of 700 to 900 nm.

In addition, the absorption dichroic ratio D of the optically anisotropic film 1 at the maximum absorption wavelength of the coloring agent D-1 was 0.21.

Example 2

A 4%-by-weight aqueous solution of PVA103 (manufactured by Kuraray Co., Ltd.) was spin-coated on the optically anisotropic film 1 manufactured in Example 1, and heated at 100° C. for 2 minutes to form a polyvinyl alcohol (PVA) layer having a thickness of 1.0 μm on the optically anisotropic film 1, thereby obtaining a laminate having the optically anisotropic film and the PVA layer.

Furthermore, the oxygen permeability of the PVA layer was 10 mL/m$^2$-day atm or less.

Example 3

A coating liquid 2 for an optically anisotropic film having the following composition was prepared.

| | |
|---|---|
| The liquid crystal compound L-1 | 50 parts by mass |
| The liquid crystal compound L-2 | 50 parts by mass |
| The coloring agent D-1 | 5 parts by mass |
| The photopolymerization initiator PI-1 | 0.50 parts by mass |
| The fluorine-containing compound F-1 | 0.20 parts by mass |
| Chloroform | 560 parts by mass |

A coating liquid 2 for an optically anisotropic film was applied onto a glass substrate with a rubbed polyimide alignment layer (SE-130, manufactured by Nissan Chemical Corporation) by spin-coating to form a coating film, which was heated at 210° C. for one minute and then slowly cooled to 60° C. Thereafter, nitrogen purge was performed so as to create an atmosphere with an oxygen concentration of 1.0% by volume or less, and the coating film was irradiated with ultraviolet rays at an irradiation dose of 500 mJ/cm$^2$ using a high-pressure mercury lamp to manufacture an optically anisotropic film 3.

The optical characteristics of the obtained optically anisotropic film 3 were measured using AxoScan OPMF-1 (manufactured by Opto Science, Inc.), and it was thus found that Re(550) was 142 nm, Re(450)/Re(550) was 0.70, and Re(650)/Re(550) was 1.17.

In addition, in a case where absorption in the infrared region was confirmed using a spectrophotometer (MPC-3100 (manufactured by SHIMADZU Corporation)) equipped with a polarizer for infrared rays, it was confirmed that a peak derived from the J-aggregate was exhibited at 868 nm. Further, it was confirmed that the absorption in a direction parallel to the fast axis of the optically anisotropic film is larger than the absorption in a direction parallel to the slow axis at a wavelength of 700 to 900 nm.

In addition, the absorption dichroic ratio D of the optically anisotropic film 3 at the maximum absorption wavelength of the coloring agent D-1 was 0.13.

Example 4

A 4%-by-weight aqueous solution of PVA103 (manufactured by Kuraray Co., Ltd.) was spin-coated on the optically anisotropic film 3 manufactured in Example 3, and heated at 100° C. for 2 minutes to form a PVA layer having a thickness of 1.0 μm on the optically anisotropic film 3, thereby obtaining a laminate having the optically anisotropic film and the PVA layer.

Comparative Example 1

A coating liquid 3 for an optically anisotropic film having the following composition was prepared.

| | |
|---|---|
| The liquid crystal compound L-1 | 50 parts by mass |
| The liquid crystal compound L-2 | 50 parts by mass |
| The photopolymerization initiator PI-1 | 0.50 parts by mass |
| The fluorine-containing compound F-I | 0.20 parts by mass |
| Chloroform | 560 parts by mass |

A coating film was formed by the same method as in Example 1, heated at 210° C. for 1 minute, and then slowly cooled to 60° C. Thereafter, nitrogen purge was performed so as to create an atmosphere with an oxygen concentration of 1.0% by volume or less, and the coating film was irradiated with ultraviolet rays at an irradiation dose of 500 mJ/cm$^2$ using a high-pressure mercury lamp to manufacture an optically anisotropic film C1.

The optical characteristics of the obtained optically anisotropic film C1 were measured using AxoScan OPMF-1 (manufactured by Opto Science, Inc.), and it was thus found that Re(550) was 145 nm, Re(450)/Re(550) was 0.68, and Re(650)/Re(550) was 1.07.

Comparative Example 2

A coating liquid 4 for an optically anisotropic film having the following composition was prepared.

| | |
|---|---|
| The following liquid crystal compound L-1 | 43 parts by mass |
| The following liquid crystal compound L-2 | 43 parts by mass |
| The following liquid crystal compound L-3 | 14 parts by mass |
| The coloring agent D-2 | 10 parts by mass |
| The photopolymerization initiator PI-1 | 0.50 parts by mass |
| The fluorine-containing compound F-1 | 0.20 parts by mass |
| Chloroform | 560 parts by mass |

A coating film was formed by the same method as in Example 1, heated at 240° C. for 1 minute, and then rapidly cooled to 120° C. Thereafter, nitrogen purge was performed so as to create an atmosphere with an oxygen concentration of 1.0% by volume or less, and the coating film was irradiated with ultraviolet rays at an irradiation dose of 500 mJ/cm$^2$ using a high-pressure mercury lamp to manufacture an optically anisotropic film C2.

The optical characteristics of the obtained optically anisotropic film C2 were measured using AxoScan OPMF-1 (manufactured by Opto Science, Inc.), and it was thus found that Re(550) was 140 nm, Re(450)/Re(550) was 0.82, and Re(650)/Re(550) was 1.13.

In addition, in a case where absorption in the infrared region was confirmed using a spectrophotometer (MPC-3100 (manufactured by SHIMADZU Corporation)) equipped with a polarizer for infrared rays, it was confirmed that a peak (maximum absorption wavelength: $\lambda$max) derived from the coloring agent D-2 was exhibited at 810 nm. Further, it was confirmed that the absorption in a direction parallel to the fast axis of the optically anisotropic film is larger than the absorption in a direction parallel to the slow axis at a wavelength of 700 to 900 nm.

In addition, the absorption dichroic ratio D of the optically anisotropic film C3 at the maximum absorption wavelength of the coloring agent D2 was 0.33.

<Light Resistance Test>

The optically anisotropic films and the laminates manufactured in Examples and Comparative Examples were irradiated with xenon light at 250,000 Lx for 300 hours using a Super Xenon Weather Meter "SX-75" (manufactured by manufactured by Suga Test Instruments Co., Ltd., condition of 60° C. and 50% RH), via TD80UL (manufactured by FUJIFILM Corporation). After a lapse of a predetermined period of time, the optically anisotropic films and the laminates were taken out, and changes in the absorption spectra thereof were measured. The evaluation results are shown in Table 1 below.

A: A change in the absorbance at $\lambda$max is less than 10%.
B: A change in the absorbance at $\lambda$max is 10% or more and less than 50%.
C: A change in the absorbance at $\lambda$max is 50% or more.

In the "Association state" column in Table 1, a case where a J-aggregate is included in the optically anisotropic film is denoted as "J-Association", and a case where a coloring agent is included in the state of a single molecule as it is, not the J-aggregate, is denoted as "Single molecule".

As shown in the table, the optically anisotropic film of the embodiment of the present invention had a larger Re(650)/Re(550) (1.15 or more) with a smaller Re(450)/Re(550) (0.80 or less), and thus exhibited more ideal dispersion characteristics.

Above all, it was confirmed that in a case where the optically anisotropic film has a gas barrier layer, it has excellent light resistance.

What is claimed is:

1. An optically anisotropic film comprising a J-aggregate having an absorption peak of a J-band on a wavelength side longer than a wavelength of 700 nm,
   wherein an absorption at a wavelength of 700 to 900 nm in a fast axis direction of the optically anisotropic film is larger than an absorption at a wavelength of 700 to 900 nm in a slow axis direction of the optically anisotropic film, and
   wherein in a case where a wavelength exhibiting a maximum absorbance at the wavelength of 700 to 900 nm in the fast axis direction of the optically anisotropic film is defined as a wavelength of X, a ratio D of an absorbance at the wavelength of X in the slow axis direction of the optically anisotropic film to an absorbance at the wavelength of X in the fast axis direction of the optically anisotropic film satisfies a relationship of Formula (C), $$0.01 < D < 0.61 \quad \text{Formula (C)}.$$

2. The optically anisotropic film according to claim 1, wherein the absorption peak is positioned in a wavelength range of 700 to 900 nm.

3. The optically anisotropic film according to claim 2, wherein the optically anisotropic film satisfies relationships of Formula (A) and Formula (B), $$Re(450)/Re(550) < 1.00 \quad \text{Formula (A)}$$

$$Re(650)/Re(550) > 1.00, \quad \text{Formula (B)}$$

in the formulae, Re(450) represents an in-plane retardation of the optically anisotropic film at a wavelength of 450 nm, Re(550) represents an in-plane retardation of the optically anisotropic film at a wavelength of 550 nm, and Re(650) represents an in-plane retardation of the optically anisotropic film at a wavelength of 650 nm.

4. The optically anisotropic film according to claim 2, wherein the optically anisotropic film is formed of a composition including a liquid crystal compound or a polymer, and a coloring agent, and
the J-aggregate includes the coloring agent.

TABLE 11

| | Example 1 | Example 2 | Example 3 | Example 4 | Comparative Example 1 | Comparative Example 2 |
|---|---|---|---|---|---|---|
| Coloring agent | D-1 | D-1 | D-1 | D-1 | — | D-2 |
| $\lambda$max | 868 nm | 868 nm | 868 nm | 868 nm | — | 810 nm |
| Association state | J-Association | J-Association | J-Association | J-Association | — | Single molecule |
| Re(450) | 140 nm | 140 nm | 142 nm | 142 nm | 145 nm | 140 nm |
| Re(450)/Re(550) | 0.80 | 0.80 | 0.70 | 0.70 | 0.68 | 0.82 |
| Re(650)/Re(550) | 1.21 | 1.21 | 1.17 | 1.17 | 1.07 | 1.13 |
| Ratio D | 0.21 | 0.21 | 0.13 | 0.13 | — | 0.33 |
| Presence or absence of PVA layer | Absent | Present | Absent | Present | Absent | Absent |
| Light resistance | B | A | B | A | — | C |

5. The optically anisotropic film according to claim 4, wherein the coloring agent is a near-infrared absorbing coloring agent.

6. The optically anisotropic film according to claim 2, wherein an in-plane retardation at a wavelength of 550 nm is 110 to 160 nm.

7. A laminate comprising:
the optically anisotropic film according to claim 2; and
a gas barrier layer arranged on the optically anisotropic film.

8. A circularly polarizing plate comprising:
the optically anisotropic film according to claim 2; and
a polarizer.

9. A display device comprising:
a display element; and
the circularly polarizing plate according to claim 8, arranged on the display element.

10. The optically anisotropic film according to claim 1, wherein the optically anisotropic film satisfies relationships of Formula (A) and Formula (B), $$Re(450)/Re(550)<1.00 \qquad \text{Formula (A)}$$

$$Re(650)/Re(550)>1.00, \qquad \text{Formula (B)}$$

in the formulae, Re(450) represents an in-plane retardation of the optically anisotropic film at a wavelength of 450 nm, Re(550) represents an in-plane retardation of the optically anisotropic film at a wavelength of 550 nm, and Re(650) represents an in-plane retardation of the optically anisotropic film at a wavelength of 650 nm.

11. The optically anisotropic film according to claim 10, wherein the optically anisotropic film is formed of a composition including a liquid crystal compound or a polymer, and a coloring agent, and
the J-aggregate includes the coloring agent.

12. The optically anisotropic film according to claim 1, wherein the optically anisotropic film is formed of a composition including a liquid crystal compound or a polymer, and a coloring agent, and
the J-aggregate includes the coloring agent.

13. The optically anisotropic film according to claim 12, wherein the coloring agent is a near-infrared absorbing coloring agent.

14. A circularly polarizing plate comprising:
the optically anisotropic film according to claim 1; and
a polarizer.

15. A display device comprising:
a display element; and
the circularly polarizing plate according to claim 14, arranged on the display element.

16. An optically anisotropic film comprising a J-aggregate having an absorption peak of a J-band on a wavelength side longer than a wavelength of 700 nm,
wherein an absorption at a wavelength of 700 to 900 nm in a fast axis direction of the optically anisotropic film is larger than an absorption at a wavelength of 700 to 900 nm in a slow axis direction of the optically anisotropic film, and
wherein an in-plane retardation at a wavelength of 550 nm is 110 to 160 nm.

17. A laminate comprising:
an optically anisotropic film; and
a gas barrier layer arranged on the optically anisotropic film,
wherein the optically anisotropic film comprising a J-aggregate having an absorption peak of a J-band on a wavelength side longer than a wavelength of 700 nm, and
wherein an absorption at a wavelength of 700 to 900 nm in a fast axis direction of the optically anisotropic film is larger than an absorption at a wavelength of 700 to 900 nm in a slow axis direction of the optically anisotropic film.

18. A circularly polarizing plate comprising:
the laminate according to claim 17; and
a polarizer.

* * * * *